US009298104B2

(12) United States Patent
Tromp et al.

(10) Patent No.: US 9,298,104 B2
(45) Date of Patent: *Mar. 29, 2016

(54) SUBSTRATE HOLDER, LITHOGRAPHIC APPARATUS, AND DEVICE MANUFACTURING METHOD

(71) Applicant: ASML NETHERLANDS B.V., Veldhoven (NL)

(72) Inventors: Siegfried Alexander Tromp, Papendrecht (NL); Nicolaas Ten Kate, Almkerk (NL); Raymond Wilhelmus Louis Lafarre, Helmond (NL)

(73) Assignee: ASML NETHERLANDS B.V., Veldhoven (NL)

( * ) Notice: Subject to any disclaimer, the term of this patent is extended or adjusted under 35 U.S.C. 154(b) by 0 days.

This patent is subject to a terminal disclaimer.

(21) Appl. No.: 14/563,792

(22) Filed: Dec. 8, 2014

(65) Prior Publication Data

US 2015/0092168 A1    Apr. 2, 2015

Related U.S. Application Data

(63) Continuation of application No. 13/722,779, filed on Dec. 20, 2012, now Pat. No. 8,908,143.

(60) Provisional application No. 61/580,406, filed on Dec. 27, 2011.

(51) Int. Cl.
*G03F 7/20* (2006.01)
*H01L 21/66* (2006.01)
(Continued)

(52) U.S. Cl.
CPC ............ *G03F 7/70716* (2013.01); *G03F 7/707* (2013.01); *G03F 7/7085* (2013.01); *G03F 7/7095* (2013.01); *G03F 7/70875* (2013.01); *H01L 21/67109* (2013.01);
(Continued)

(58) Field of Classification Search
CPC ............ G03F 7/70716; G03F 7/70858; G03F 7/70866; G03F 7/70875; G03F 7/7095; G03F 7/707; G03F 7/7085; H01L 21/67109; H01L 21/67248; H01L 21/6838
See application file for complete search history.

(56) References Cited

U.S. PATENT DOCUMENTS

| 7,027,132 B2 | 4/2006 | Ottens et al. |
| 7,187,433 B2 | 3/2007 | Ottens et al. |
| 7,532,310 B2 | 5/2009 | Mertens et al. |

(Continued)

FOREIGN PATENT DOCUMENTS

| EP | 0 406 669 | 1/1991 |
| JP | 2001-257200 | 9/2001 |

(Continued)

*Primary Examiner* — Peter B Kim
*Assistant Examiner* — Michelle Iacoletti
(74) *Attorney, Agent, or Firm* — Pillsbury Winthrop Shaw Pittman LLP

(57) ABSTRACT

A substrate holder for use in a lithographic apparatus. The substrate holder comprises a main body, a plurality of burls and a heater and/or a temperature sensor. The main body has a surface. The plurality of burls project from the surface and have end surfaces to support a substrate. The heater and/or temperature sensor is provided on the main body surface. The substrate holder is configured such that when a substrate is supported on the end surfaces, a thermal conductance between the heater and/or temperature sensor and the substrate is greater than a thermal conductance between the heater and/or temperature sensor and the main body surface.

20 Claims, 9 Drawing Sheets

(51) Int. Cl.
*H01L 21/683* (2006.01)
*H01L 21/67* (2006.01)

(52) U.S. Cl.
CPC ..... *H01L 21/67248* (2013.01); *H01L 21/6838* (2013.01); *H01L 22/26* (2013.01); *H01L 2924/0002* (2013.01)

(56) References Cited

U.S. PATENT DOCUMENTS

| | | |
|---|---|---|
| 7,649,611 B2 | 1/2010 | Zaal et al. |
| 8,228,487 B2 | 7/2012 | Rijpma et al. |
| 2002/0179585 A1 | 12/2002 | Maltabes et al. |
| 2004/0207824 A1 | 10/2004 | Lof et al. |
| 2006/0038968 A1 | 2/2006 | Kemper et al. |
| 2007/0054424 A1 | 3/2007 | Natsuhara et al. |
| 2007/0205788 A1 | 9/2007 | Natsuhara et al. |
| 2008/0212046 A1 | 9/2008 | Riepen et al. |
| 2009/0207392 A1 | 8/2009 | Rijpma et al. |
| 2009/0215201 A1 | 8/2009 | Benjamin et al. |
| 2009/0262318 A1 | 10/2009 | Van Den Dungen et al. |
| 2009/0279060 A1 | 11/2009 | Direcks et al. |
| 2009/0279062 A1 | 11/2009 | Direcks et al. |
| 2009/0284715 A1 | 11/2009 | Watso et al. |
| 2010/0210115 A1 | 8/2010 | Hara et al. |
| 2011/0222032 A1 | 9/2011 | Ten Kate et al. |
| 2011/0222033 A1 | 9/2011 | Ten Kate et al. |
| 2012/0147353 A1 | 6/2012 | Lafarre et al. |
| 2012/0212725 A1 | 8/2012 | Lafarre et al. |
| 2012/0274920 A1 | 11/2012 | Bex et al. |
| 2013/0038854 A1 | 2/2013 | Kunnen et al. |
| 2013/0094005 A1 | 4/2013 | Kunnen et al. |
| 2013/0094009 A1 | 4/2013 | Lafarre et al. |

FOREIGN PATENT DOCUMENTS

| | | |
|---|---|---|
| JP | 2009-200486 | 9/2009 |
| JP | 2009-267404 | 11/2009 |
| JP | 2010-068003 | 3/2010 |
| JP | 2011-192992 | 9/2011 |
| WO | 99/49504 | 9/1999 |
| WO | 2013/113568 | 8/2013 |
| WO | 2013/113569 | 8/2013 |
| WO | 2013/156236 | 10/2013 |

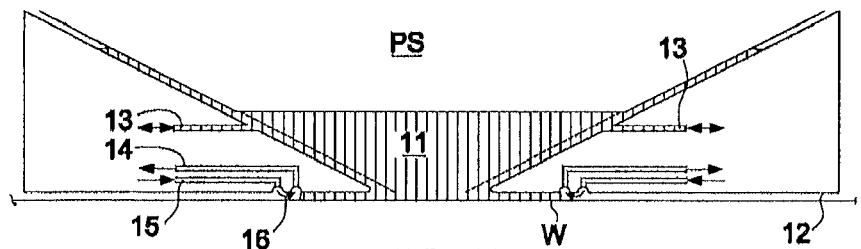
FIG 5
FIG. 6
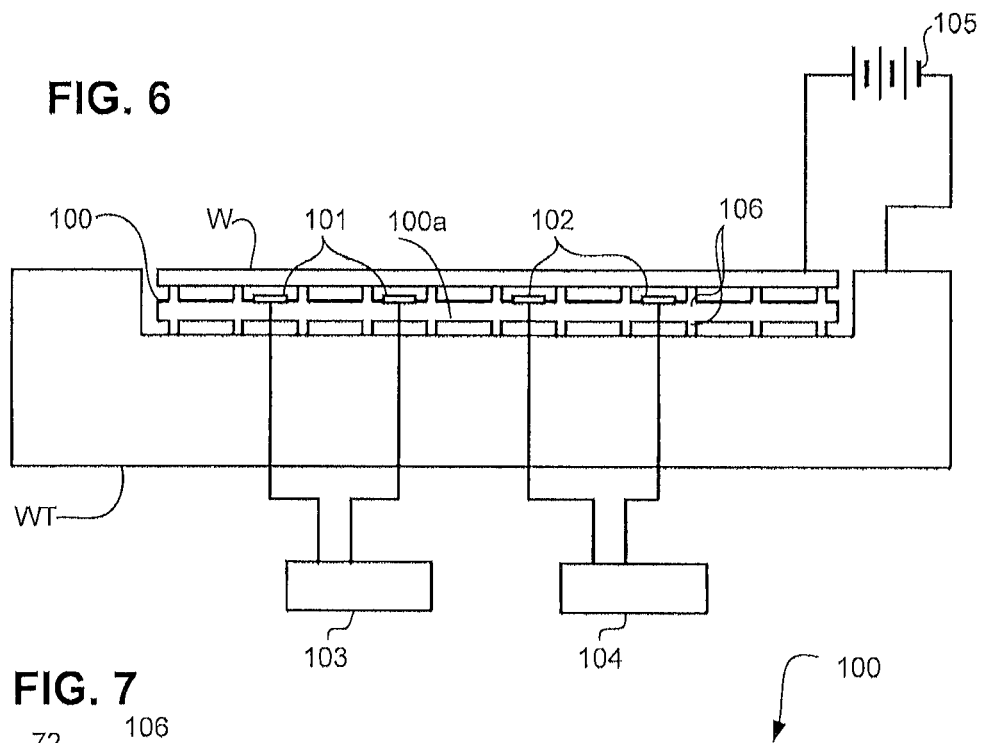
FIG. 7
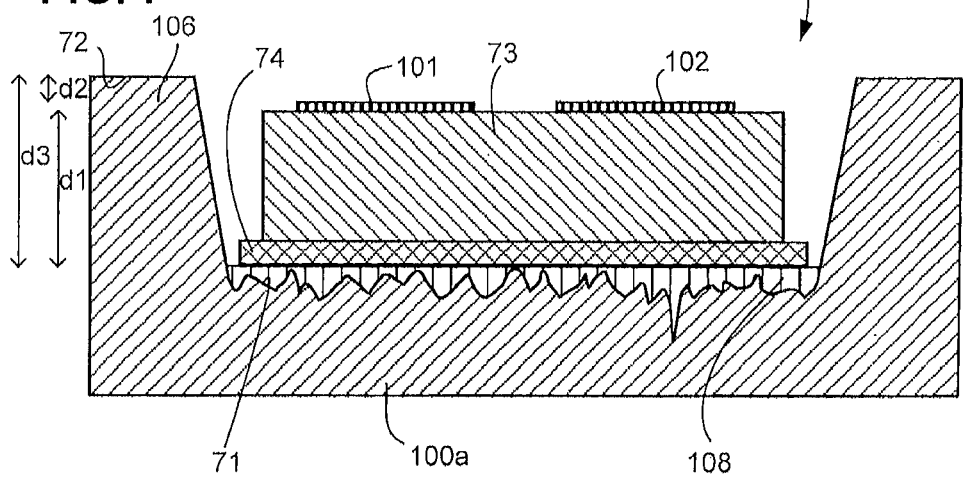

SUBSTRATE HOLDER, LITHOGRAPHIC APPARATUS, AND DEVICE MANUFACTURING METHOD

This application is a continuation of U.S. patent application Ser. No. 13/722,779, filed Dec. 20, 2012, which claims the benefit of priority from U.S. Patent Application No. 61/580,406, filed on Dec. 27, 2011, the entire content of each of the foregoing applications is incorporated herein by reference.

FIELD

The present invention relates to a substrate holder, a lithographic apparatus, and a device manufacturing method.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

Lithography is widely recognized as one of the key steps in the manufacture of ICs and other devices and/or structures. However, as the dimensions of features made using lithography become smaller, lithography is becoming a more critical factor for enabling miniature IC or other devices and/or structures to be manufactured. A theoretical estimate of the limits of pattern printing can be given by the Rayleigh criterion for resolution as shown in equation (1):

$$CD = k_1 * \frac{\lambda}{NA} \quad (1)$$

where λ is the wavelength of the radiation used, NA is the numerical aperture of the projection system used to print the pattern, k1 is a process dependent adjustment factor, also called the Rayleigh constant, and CD is the feature size (or critical dimension) of the printed feature. It follows from equation (1) that reduction of the minimum printable size of features can be obtained in three ways: by shortening the exposure wavelength λ, by increasing the numerical aperture NA or by decreasing the value of k1.

It has been proposed to immerse the substrate in the lithographic projection apparatus in a liquid having a relatively high refractive index, e.g. water, so as to fill a space between the final element of the projection system and the substrate. In an embodiment, the liquid is distilled water, although another liquid can be used. An embodiment of the present invention will be described with reference to liquid. However, another fluid may be suitable, particularly a wetting fluid, an incompressible fluid and/or a fluid with higher refractive index than air, desirably a higher refractive index than water. Fluids excluding gases are particularly desirable. The point of this is to enable imaging of smaller features since the exposure radiation will have a shorter wavelength in the liquid. (The effect of the liquid may also be regarded as increasing the effective numerical aperture (NA) of the system and also increasing the depth of focus.) Other immersion liquids have been proposed, including water with solid particles (e.g. quartz) suspended therein, or a liquid with a nano-particle suspension (e.g. particles with a maximum dimension of up to 10 nm). The suspended particles may or may not have a similar or the same refractive index as the liquid in which they are suspended. Other liquids which may be suitable include a hydrocarbon, such as an aromatic, a fluorohydrocarbon, and/or an aqueous solution.

In order to shorten the exposure wavelength and, thus, reduce the minimum printable size, it has been proposed to use an extreme ultraviolet (EUV) radiation source. EUV radiation is electromagnetic radiation having a wavelength within the range of 5-20 nm, for example within the range of 13-14 nm. It has further been proposed that EUV radiation with a wavelength of less than 10 nm could be used, for example within the range of 5-10 nm such as 6.7 nm or 6.8 nm. Such radiation is termed extreme ultraviolet radiation or soft x-ray radiation. Possible sources include, for example, laser-produced plasma sources, discharge plasma sources, or sources based on synchrotron radiation provided by an electron storage ring.

EUV radiation may be produced using a plasma. A radiation system to produce EUV radiation may include a laser to excite a fuel to provide the plasma, and a source collector apparatus to contain the plasma. The plasma may be created, for example, by directing a laser beam at a fuel, such as particles of a suitable material (e.g. tin), or a stream of a suitable gas or vapor, such as Xe gas or Li vapor. The resulting plasma emits output radiation, e.g., EUV radiation, which is collected using a radiation collector. The radiation collector may be a mirrored normal incidence radiation collector, which receives the radiation and focuses the radiation into a beam. The source collector apparatus may include an enclosing structure or chamber arranged to provide a vacuum environment to support the plasma. Such a radiation system is typically termed a laser produced plasma (LPP) source.

SUMMARY

In a conventional lithography apparatus, the substrate to be exposed may be supported by a substrate holder which in turn is supported by a substrate table. The substrate holder is often a flat rigid disc corresponding in size and shape to the substrate (although it may have a different size or shape). It has an array of projections, referred to as burls or pimples, projecting from at least one side. In an embodiment, the substrate holder has an array of projections on two opposite sides. In this case, when the substrate holder is placed on the substrate table, the main body of the substrate holder is held a small distance above the substrate table while the ends of the burls on one side of the substrate holder lie on the surface of the substrate table. Similarly, when the substrate rests on the top of the burls on the opposite side of the substrate holder, the substrate is spaced apart from the main body of the substrate holder. The purpose of this is to help prevent a particle (i.e. a contaminating particle such as a dust particle) which might be present on either the substrate table or substrate holder from distorting the substrate holder or substrate. Since the total surface area of the burls is only a small fraction of the total area of the substrate or substrate holder, it is highly probable that any particle will lie between burls and its presence will have no effect. Often, the substrate holder and substrate are accommodated within a recess in the substrate table so that the upper surface of the substrate is substantially coplanar with the upper surface of the substrate table.

Due to the high accelerations experienced by the substrate in use of a high-throughput lithographic apparatus, it is not sufficient to allow the substrate simply to rest on the burls of the substrate holder. It is clamped in place. Two methods of clamping the substrate in place are known—vacuum clamping and electrostatic clamping. In vacuum clamping, the space between the substrate holder and substrate and optionally between the substrate table and substrate holder are partially evacuated so that the substrate is held in place by the higher pressure of gas or liquid above it. Vacuum clamping however may not be used where the beam path and/or the environment near the substrate or substrate holder is kept at a low or very low pressure, e.g. for extreme ultraviolet (EUV) radiation lithography. In this case, it may not be possible to develop a sufficiently large pressure difference across the substrate (or substrate holder) to clamp it. Electrostatic clamping may therefore be used instead or additionally. In electrostatic clamping, a potential difference is established between the substrate, or an electrode plated on its lower surface, and an electrode provided on the substrate table and/or substrate holder. The two electrodes behave as a large capacitor and substantial clamping force can be generated with a reasonable potential difference. An electrostatic arrangement can be such that a single pair of electrodes, one on the substrate table and one on the substrate, clamps together the complete stack of substrate table, substrate holder and substrate. In an arrangement, one or more electrodes may be provided on the substrate holder so that the substrate holder is clamped to the substrate table and the substrate is separately clamped to the substrate holder.

Temperature control over the substrate surface is significant, in particular in an immersion system which is sensitive to temperature variation due to liquid (e.g. water) evaporation effects. This temperature variation can lead to thermal stress in the substrate which eventually may contribute to overlay error. To achieve highly accurate temperature control, real time local measurement of the temperature combined with active heating is desired. Such a measurement and heating system is integrated into the system, i.e. in the substrate holder (e.g., wafer table) and/or substrate table (e.g., mirror block). A thin film stack can be used to make a structure that can both measure and heat, and also offer opportunities for integration into the substrate table.

It is desirable, for example, to provide a substrate holder or substrate table on which one or more heaters and/or temperature sensors are formed.

According to an aspect of the invention, there is provided a substrate holder for use in a lithographic apparatus, the substrate holder comprising: a main body having a surface; a plurality of burls projecting from the surface and having end surfaces to support a substrate; and a heater and/or a temperature sensor, on the main body surface, wherein when a substrate is supported on the end surfaces, a thermal conductance between the heater and/or temperature sensor and the substrate is greater than a thermal conductance between the heater and/or temperature sensor and the main body surface.

According to an aspect of the invention, there is provided a substrate holder for use in a lithographic apparatus, the substrate holder comprising: a main body having a surface; a plurality of burls projecting from the surface and having end surfaces to support a substrate; and a heater and/or a temperature sensor, on the main body surface, wherein when a substrate is supported on the end surfaces, a distance between the heater and/or temperature sensor and the main body surface is greater than a distance between the heater and/or temperature sensor and the substrate.

According to an aspect of the invention, there is provided a lithographic apparatus, comprising: a support structure configured to support a patterning device; a projection system arranged to project a beam patterned by the patterning device onto a substrate; and a substrate holder arranged to hold the substrate, the substrate holder comprising: a main body having a surface; a plurality of burls projecting from the surface and having end surfaces to support a substrate; and a heater and/or a temperature sensor provided on the main body surface, wherein when a substrate is supported on the end surfaces, a thermal conductance between the heater and/or temperature sensor and the substrate is greater than a thermal conductance between the heater and/or temperature sensor and the main body surface.

According to an aspect of the invention, there is provided a device manufacturing method using a lithographic apparatus, the method comprising:

projecting a beam patterned by a patterning device onto a substrate while holding the substrate on a substrate holder, the substrate holder comprising: a main body having a surface, a plurality of burls projecting from the surface and having end surfaces supporting the substrate, and a heater and/or a temperature sensor, on the main body surface, wherein a thermal conductance between the heater and/or temperature sensor and the substrate is greater than a thermal conductance between the heater and/or temperature sensor and the main body surface.

According to an aspect of the invention, there is provided a device manufacturing method using a lithographic apparatus, the method comprising:

projecting a beam patterned by a patterning device onto a substrate while holding the substrate on a substrate holder, the substrate holder comprising: a main body having a surface, a plurality of burls projecting from the surface and having end surfaces supporting the substrate, and a heater and/or a temperature sensor, on the main body surface, wherein a distance between the heater and/or temperature sensor and the main body surface is greater than a distance between the heater and/or temperature sensor and the substrate.

BRIEF DESCRIPTION OF THE DRAWINGS

Embodiments of the invention will now be described, by way of example only, with reference to the accompanying schematic drawings in which corresponding reference symbols indicate corresponding parts, and in which:

FIG. 5 depicts, in cross-section, a barrier member which may be used in an embodiment of the present invention as an immersion liquid supply system;

FIG. 6 depicts in cross-section a substrate table and a substrate holder according to an embodiment of the invention;

FIG. 7 depicts in cross-section a substrate holder according to an embodiment of the invention;

DETAILED DESCRIPTION

Figure 1:
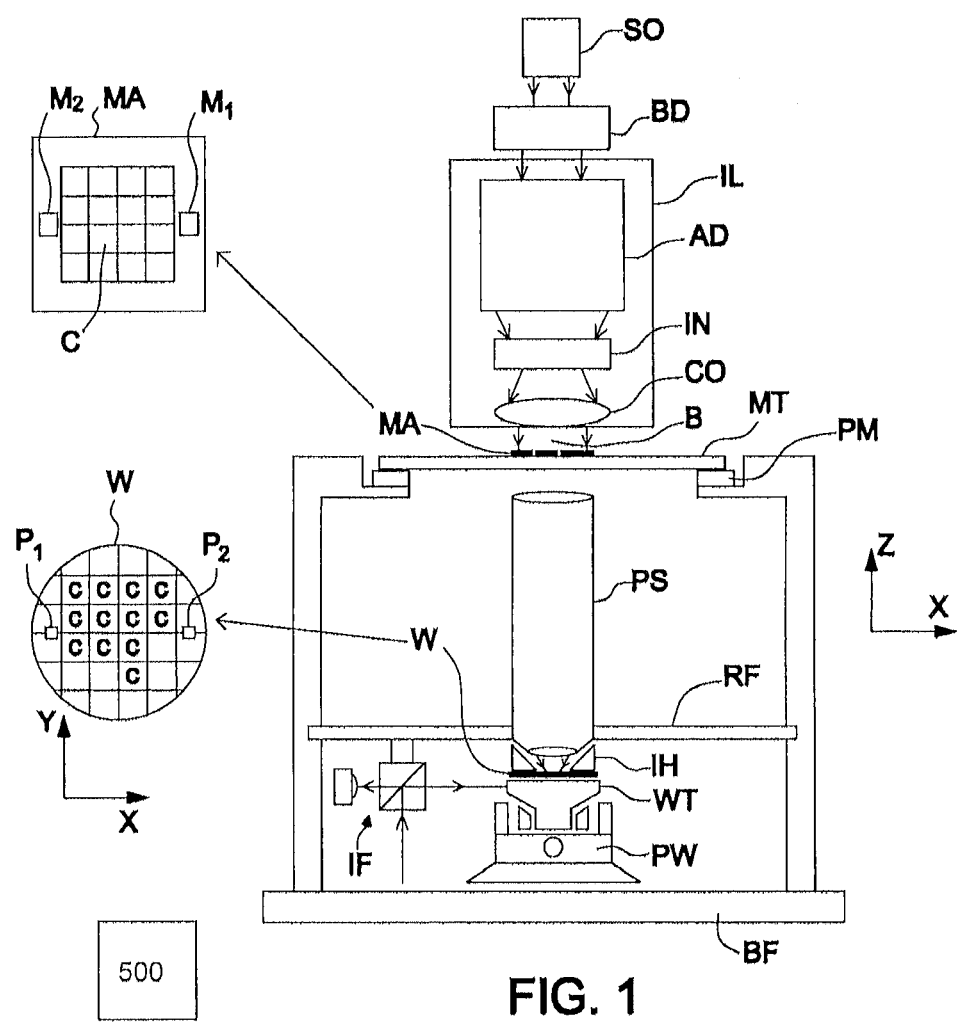
FIG. 1 depicts a lithographic apparatus according to an embodiment of the invention.

FIG. 1 schematically depicts a lithographic apparatus according to one embodiment of the invention. The apparatus comprises:

an illumination system (illuminator) IL configured to condition a radiation beam B (e.g. UV radiation, DUV radiation or EUV radiation);

a support structure (e.g. a mask table) MT constructed to support a patterning device (e.g. a mask) MA and connected to a first positioner PM configured to accurately position the patterning device in accordance with certain parameters;

a substrate table (e.g. a wafer table) WT constructed to hold a substrate (e.g. a resist-coated wafer) W and connected to a second positioner PW configured to accurately position the substrate in accordance with certain parameters; and a projection system (e.g. a refractive projection lens system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure MT holds the patterning device. The support structure MT holds the patterning device in a manner that depends on the orientation of the patterning device, the design of the lithographic apparatus, and other conditions, for example whether or not the patterning device is held in a vacuum environment. The support structure MT can use mechanical, vacuum, electrostatic or other clamping techniques to hold the patterning device. The support structure MT may be a frame or a table, for example, which may be fixed or movable as required. The support structure MT may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more patterning device tables). In such "multiple stage" machines the additional tables may be used in parallel, or preparatory steps may be carried out on one or more tables while one or more other tables are being used for exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AM configured to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section. Similar to the source SO, the illuminator IL may or may not be considered to form part of the lithographic apparatus. For example, the illuminator IL may be an integral part of the lithographic apparatus or may be a separate entity from the lithographic apparatus. In the latter case, the lithographic apparatus may be configured to allow the illuminator IL to be mounted thereon. Optionally, the illuminator IL is detachable and may be separately provided (for example, by the lithographic apparatus manufacturer or another supplier).

The radiation beam B is incident on the patterning device (e.g., mask) MA, which is held on the support structure (e.g., mask table) MT, and is patterned by the patterning device. Having traversed the patterning device MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam. B. Similarly, the first positioner PM and another position sensor (which is not explicitly depicted in FIG. 1) can be used to accurately position the patterning device MA with respect to the path of the radiation beam B, e.g. after mechanical retrieval from a mask library, or during a scan. In general, movement of the support structure MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the support structure MT may be connected to a short-stroke actuator only, or may be fixed. Patterning device MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device MA, the patterning device alignment marks may be located between the dies.

Figure 16:
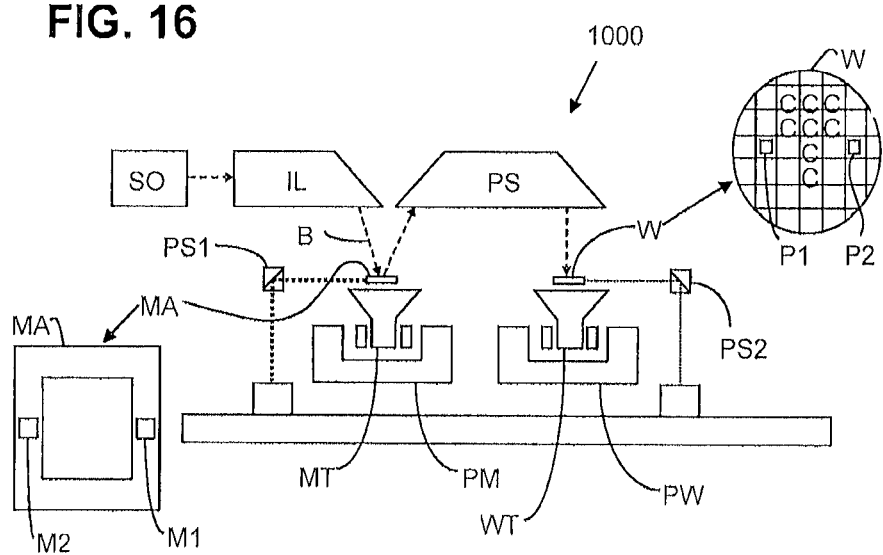
FIG. 16 depicts a lithographic apparatus according to an embodiment of the invention.

FIG. 16 schematically depicts a lithographic apparatus 1000 including a source collector apparatus SO according to an embodiment of the invention. The apparatus comprises: an illumination system (illuminator) IL configured to condition a radiation beam B (e.g. EUV radiation); a support structure (e.g. a mask table) MT constructed to support a patterning device (e.g. a mask or a reticle) MA and connected to a first positioner PM configured to accurately position the patterning device; a substrate table (e.g. a wafer table) WT constructed to hold a substrate (e.g. a resist-coated wafer) W and connected to a second positioner PW configured to accurately position the substrate; and a projection system (e.g. a reflective projection system) PS configured to project a pattern imparted to the radiation beam B by patterning device MA onto a target portion C (e.g. comprising one or more dies) of the substrate W. As here depicted, the apparatus is of a reflective type (e.g. employing a reflective mask).

Referring to FIG. 16, the illuminator IL receives an extreme ultra violet radiation beam from the source collector apparatus SO. Methods to produce EUV radiation include, but are not necessarily limited to, converting a material into a plasma state that has at least one element, e.g., xenon, lithium or tin, with one or more emission lines in the EUV range. In one such method, often termed laser produced plasma ("LPP") the plasma can be produced by irradiating a fuel, such as a droplet, stream or cluster of material having the required line-emitting element, with a laser beam. The source collector apparatus SO may be part of an EUV radiation system including a laser, not shown in FIG. 16, to provide the laser beam exciting the fuel. The resulting plasma emits output radiation, e.g., EUV radiation, which is collected using a radiation collector, disposed in the source collector apparatus. The laser and the source collector apparatus may be separate entities, for example when a $CO_2$ laser is used to provide the laser beam for fuel excitation. In such cases, the laser is not considered to form part of the lithographic apparatus and the radiation beam is passed from the laser to the source collector apparatus with the aid of a beam delivery system comprising, for example, one or more suitable directing mirrors and/or a beam expander. In other cases the source may be an integral part of the source collector apparatus, for example when the source is a discharge produced plasma EUV generator, often termed as a DPP source.

Figure 17:
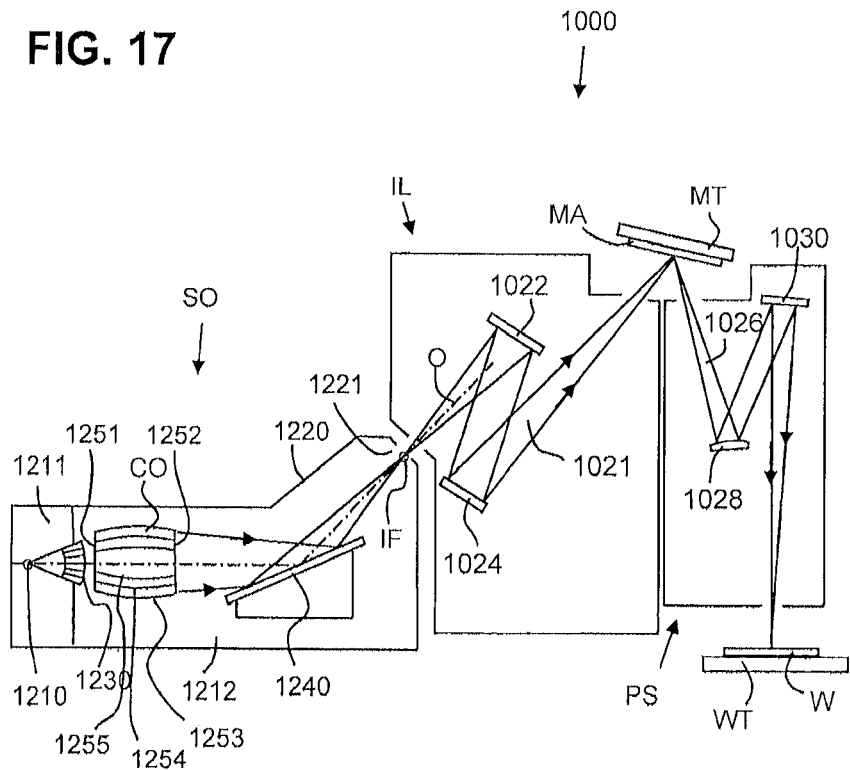
FIG. 17 is a more detailed view of the apparatus of FIG. 16.

FIG. 17 shows an embodiment of the apparatus 1000 in more detail, including the source collector apparatus SO, the illumination system IL, and the projection system PS. The source collector apparatus SO is constructed and arranged such that a vacuum environment can be maintained in an enclosing structure 1220 of the source collector apparatus SO. An EUV radiation emitting plasma 1210 may be formed by a discharge produced plasma source. EUV radiation may be produced by a gas or vapor, for example Xe gas, Li vapor or Sn vapor in which the very hot plasma 1210 is created to emit radiation in the EUV range of the electromagnetic spectrum. The very hot plasma 1210 is created by, for example, an electrical discharge causing an at least partially ionized plasma. Partial pressures of, for example, 10 Pa of Xe, Li, Sn vapor or any other suitable gas or vapor may be required for efficient generation of the radiation. In an embodiment, a plasma of excited tin (Sn) is provided to produce EUV radiation.

The radiation emitted by the hot plasma 1210 is passed from a source chamber 1211 into a collector chamber 1212 via an optional gas barrier or contaminant trap 1230 (in some cases also referred to as contaminant barrier or foil trap) which is positioned in or behind an opening in source chamber 1211. The contaminant trap 1230 may include a channel structure. Contamination trap 1230 may also include a gas barrier or a combination of a gas barrier and a channel structure. The contaminant trap or contaminant barrier 1230 further indicated herein at least includes a channel structure, as known in the art.

The collector chamber 1212 may include a radiation collector CO which may be a so-called grazing incidence collector. Radiation collector CO has an upstream radiation collector side 1251 and a downstream radiation collector side 1252. Radiation that traverses collector CO can be reflected off a grating spectral filter 1240 to be focused in a virtual source point IF. The virtual source point IF is commonly referred to as the intermediate focus, and the source collector apparatus is arranged such that the intermediate focus IF is located at or near an opening 1221 in the enclosing structure 1220. The virtual source point IF is an image of the radiation emitting plasma 1210.

Subsequently the radiation traverses the illumination system IL, which may include a facetted field mirror device 1022 and a facetted pupil mirror device 1024 arranged to provide a desired angular distribution of the radiation beam 1021, at the patterning device MA, as well as a desired uniformity of radiation intensity at the patterning device MA. Upon reflection of the beam of radiation 1021 at the patterning device MA, held by the support structure MT, a patterned beam 1026 is formed and the patterned beam 1026 is imaged by the projection system PS via reflective elements 1028, 1030 onto a substrate W held by the substrate table WT.

More elements than shown may generally be present in illumination optics unit IL and projection system PS. The grating spectral filter 1240 may optionally be present, depending upon the type of lithographic apparatus. Further, there may be more mirrors present than those shown in the Figures, for example there may be 1-6 additional reflective elements present in the projection system PS than shown in FIG. 17.

Collector optic CO, as illustrated in FIG. 17, is depicted as a nested collector with grazing incidence reflectors 1253, 1254 and 1255, just as an example of a collector (or collector mirror). The grazing incidence reflectors 1253, 1254 and 1255 are disposed axially symmetric around an optical axis O and a collector optic CO of this type is preferably used in combination with a discharge produced plasma source, often called a DPP source.

Figure 18:
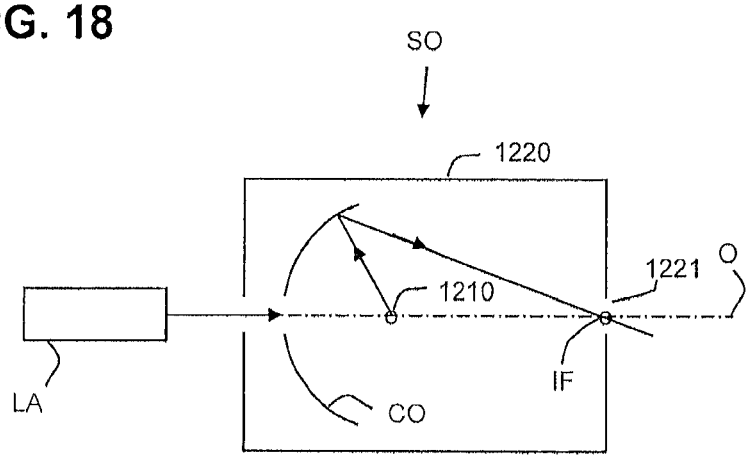
FIG. 18 is a more detailed view of a source collector apparatus of the apparatus of FIGS. 16 and 17.

In an embodiment, the source collector apparatus SO may be part of an LPP radiation system as shown in FIG. 18. A laser LA is arranged to deposit laser energy into a fuel, such as xenon (Xe), tin (Sn) or lithium (Li), creating the highly ionized plasma 1210 with electron temperatures of several 10's of eV. The energetic radiation generated during de-excitation and recombination of these ions is emitted from the plasma, collected by a near normal incidence collector optic CO and focused onto the opening 1221 in the enclosing structure 1220.

The depicted apparatus could be used in at least one of the following modes:

1. In step mode, the support structure MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the support structure MT and the substrate table WT are scanned synchronously while a pattern imparted to the radiation beam is projected onto a target portion C (i.e. a single dynamic exposure). The velocity and direction of the substrate table WT relative to the support structure MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the support structure MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

In many lithographic apparatus a fluid, in particular a liquid for example, is provided between the final element of the projection system using a liquid supply system IH to enable imaging of smaller features and/or increase the effective NA of the apparatus. An embodiment of the invention is described further below with reference to such an immersion apparatus, but may equally be embodied in a non-immersion apparatus. Arrangements to provide liquid between a final element of the projection system and the substrate can be classed into at least two general categories. These are the bath type arrangement and the so called localized immersion system. In the bath type arrangement substantially the whole of the substrate and optionally part of the substrate table is submersed in a bath of liquid. The so called localized immersion system uses a liquid supply system in which liquid is only provided to a localized area of the substrate. In the latter category, the space filled by liquid is smaller in plan than the top surface of the substrate and the area filled with liquid remains substantially stationary relative to the projection system while the substrate moves underneath that area. Anther arrangement, to which an embodiment of the invention is directed, is the all wet solution in which the liquid is unconfined. In this arrangement substantially the whole top surface of the substrate and all or part of the substrate table is covered in immersion liquid. The depth of the liquid covering at least the substrate is small. The liquid may be a film, such as a thin film, of liquid on the substrate.

Four different types of localized liquid supply systems are illustrated in FIGS. 2-5. Any of the liquid supply devices of FIGS. 2-5 may be used in an unconfined system; however, sealing features are not present, are not activated, are not as efficient as normal or are otherwise ineffective to seal liquid to only the localized area.

Figure 2:
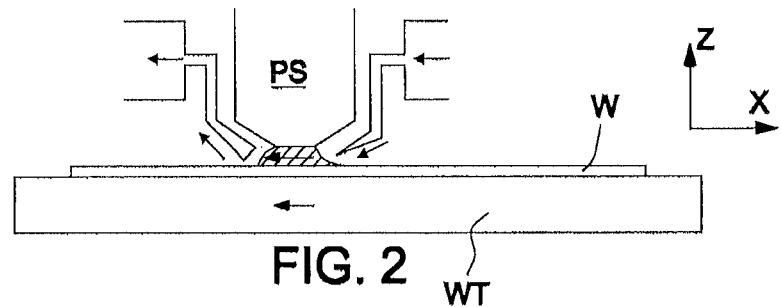
FIGS. 2 and 3 depict a liquid supply system for use in a lithographic projection apparatus.
Figure 3:
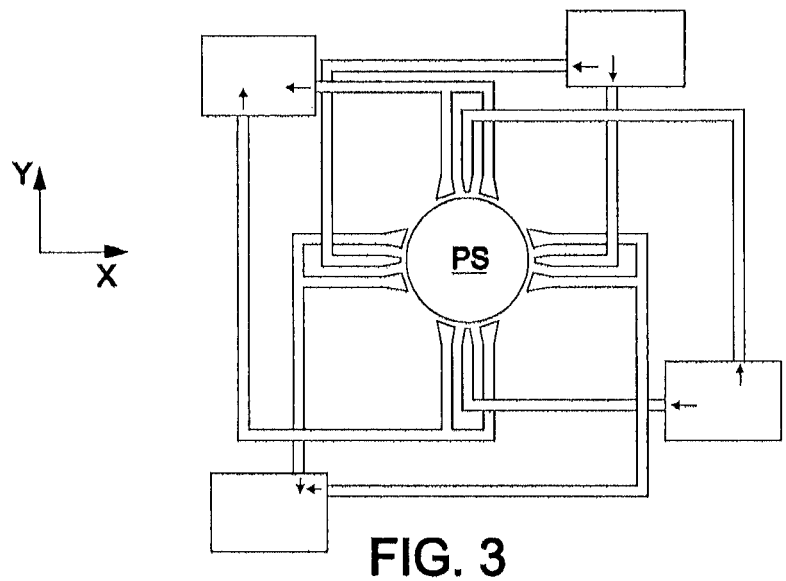

One of the arrangements proposed for a localized immersion system is for a liquid supply system to provide liquid on only a localized area of the substrate and in between the final element of the projection system and the substrate using a liquid confinement system (the substrate generally has a larger surface area than the final element of the projection system). One way which has been proposed to arrange for this is disclosed in PCT patent application publication no. WO 99/49504. As illustrated in FIGS. 2 and 3, liquid is supplied by at least one inlet onto the substrate, desirably along the direction of movement of the substrate relative to the final element, and is removed by at least one outlet after having passed under the projection system. That is, as the substrate is scanned beneath the element in a −X direction, liquid is supplied at the +X side of the element and taken up at the −X side.

FIG. 2 shows the arrangement schematically in which liquid is supplied via inlet and is taken up on the other side of the element by outlet which is connected to a low pressure source. The arrows above the substrate W illustrate the direction of liquid flow, and the arrow below the substrate W illustrates the direction of movement of the substrate table. In the illustration of FIG. 2 the liquid is supplied along the direction of movement of the substrate relative to the final element, though this does not need to be the case. Various orientations and numbers of in- and out-lets positioned around the final element are possible, one example is illustrated in FIG. 3 in which four sets of an inlet with an outlet on either side are provided in a regular pattern around the final element. Arrows in liquid supply and liquid recovery devices indicate the direction of liquid flow.

Figure 4:
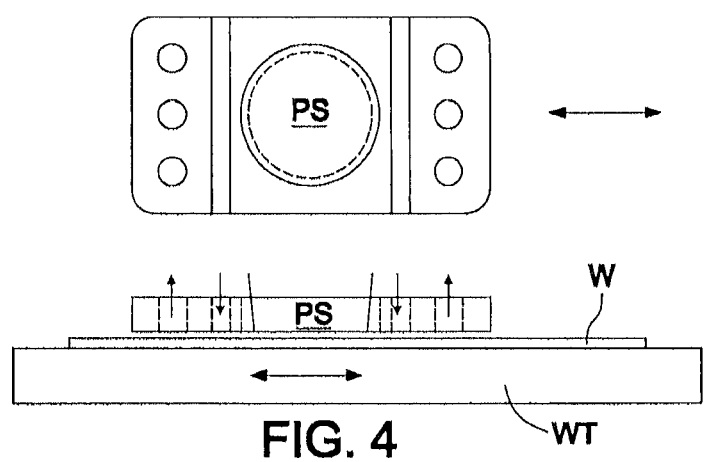
FIG. 4 depicts a further liquid supply system for use in a lithographic projection apparatus.

A further immersion lithography solution with a localized liquid supply system is shown in FIG. 4. Liquid is supplied by two groove inlets on either side of the projection system PS and is removed by a plurality of discrete outlets arranged radially outwardly of the inlets. The inlets and outlets can be arranged in a plate with a hole in its center and through which the projection beam is projected. Liquid is supplied by one groove inlet on one side of the projection system PS and removed by a plurality of discrete outlets on the other side of the projection system PS, causing a flow of a thin film of liquid between the projection system PS and the substrate W. The choice of which combination of inlet and outlets to use can depend on the direction of movement of the substrate W (the other combination of inlet and outlets being inactive). In the cross-sectional view of FIG. 4, arrows illustrate the direction of liquid flow in inlets and out of outlets.

Another arrangement which has been proposed is to provide the liquid supply system with a liquid confinement member which extends along at least a part of a boundary of the space between the final element of the projection system and the substrate table. Such an arrangement is illustrated in FIG. 5. The liquid confinement member is substantially stationary relative to the projection system in the XY plane though there may be some relative movement in the Z direction (in the direction of the optical axis). A seal is formed between the liquid confinement and the surface of the substrate. In an embodiment, a seal is formed between the liquid confinement structure and the surface of the substrate and may be a contactless seal such as a gas seal. Such a system is disclosed in United States patent application publication no. US 2004-0207824.

FIG. 5 schematically depicts a localized liquid supply system with a fluid handling structure 12. The fluid handling structure extends along at least a part of a boundary of the space between the final element of the projection system and the substrate table WT or substrate W. (Please note that reference in the following text to surface of the substrate W also refers in addition or in the alternative to a surface of the substrate table, unless expressly stated otherwise.) The fluid handling structure 12 is substantially stationary relative to the projection system in the XY plane though there may be some relative movement in the Z direction (in the direction of the optical axis). In an embodiment, a seal is formed between the barrier member and the surface of the substrate W and may be a contactless seal such as a fluid seal, desirably a gas seal.

The fluid handling structure 12 at least partly contains liquid in the space 11 between a final element of the projection system PS and the substrate W. A contactless seal 16 to the substrate W may be formed around the image field of the projection system so that liquid is confined within the space between the substrate W surface and the final element of the projection system PS. The space is at least partly formed by the fluid handling structure 12 positioned below and surrounding the final element of the projection system PS. Liquid is brought into the space below the projection system and within the fluid handling structure 12 by liquid inlet 13. The liquid may be removed by liquid outlet 13. The fluid handling structure 12 may extend a little above the final element of the projection system. The liquid level rises above the final element so that a buffer of liquid is provided. In an embodiment, the fluid handling structure 12 has an inner periphery that at the upper end closely conforms to the shape of the projection system or the final element thereof and may, e.g., be round. At the bottom, the inner periphery closely conforms to the shape of the image field, e.g., rectangular, though this need not be the case.

In an embodiment, the liquid is contained in the space 11 by a gas seal 16 which, during use, is formed between the bottom of the fluid handling structure 12 and the surface of the substrate W. The gas seal is formed by gas, e.g. air or synthetic air but, in an embodiment, $N_2$ or another inert gas. The gas in the gas seal is provided under pressure via inlet 15 to the gap between fluid handling structure 12 and substrate W. The gas is extracted via outlet 14. The overpressure on the gas inlet 15, vacuum level on the outlet 14 and geometry of the gap are arranged so that there is a high-velocity gas flow 16 inwardly that confines the liquid. The force of the gas on the liquid between the fluid handling structure 12 and the substrate W contains the liquid in a space 11. The inlets/outlets may be annular grooves which surround the space 11. The annular grooves may be continuous or discontinuous. The flow of gas 16 is effective to contain the liquid in the space 11. Such a system is disclosed in United States patent application publication no. US 2004-0207824.

The example of FIG. 5 is a so called localized area arrangement in which liquid is only provided to a localized area of the top surface of the substrate W at any one time. Other arrangements are possible, including fluid handling systems which make use of a single phase extractor or a two phase extractor as disclosed, for example, in United States patent application publication no US 2006-0038968.

Another arrangement which is possible is one which works on a gas drag principle. The so-called gas drag principle has been described, for example, in United States patent application publication nos. US 2008-0212046, US 2009-0279060, and US 2009-0279062. In that system the extraction holes are arranged in a shape which desirably has a corner. The corner may be aligned with the stepping or scanning directions. This reduces the force on the meniscus between two openings in the surface of the fluid handing structure for a given speed in the step or scan direction compared to if the two outlets were aligned perpendicular to the direction of scan.

Also disclosed in US 2008-0212046 is a gas knife positioned radially outside the main liquid retrieval feature. The gas knife traps any liquid which gets past the main liquid retrieval feature. Such a gas knife may be present in a so called gas drag principle arrangement (as disclosed in US 2008-0212046), in a single or two phase extractor arrangement (such as disclosed in United States patent application publication no. US 2009-0262318) or any other arrangement.

Many other types of liquid supply system are possible. The present invention is neither limited to any particular type of liquid supply system, nor to immersion lithography. The invention may be applied equally in any lithography. In an EUV lithography apparatus, the beam path is substantially evacuated and immersion arrangements described above are not used.

A control system 500 shown in FIG. 1 controls the overall operations of the lithographic apparatus and in particular performs an optimization process described further below. Control system 500 can be embodied as a suitably-programmed general purpose computer comprising a central processing unit. The control system 500 may further comprise volatile and non-volatile storage, one or more input and output devices such as a keyboard and screen, one or more network connections and one or more interfaces to the various parts of the lithographic apparatus. A one-to-one relationship between controlling computer and lithographic apparatus is not necessary. In an embodiment of the invention one computer can control multiple lithographic apparatuses. In an embodiment of the invention, multiple networked computers can be used to control one lithographic apparatus. The control system 500 may also be configured to control one or more associated process devices and substrate handling devices in a lithocell or cluster of which the lithographic apparatus forms a part. The control system 500 can also be configured to be subordinate to a supervisory control system of a lithocell or cluster and/or an overall control system of a fab.

FIG. 6 depicts a substrate holder 100 according to an embodiment of the invention. It is held within a recess in substrate table WT and supports substrate W. The main body of the substrate holder 100a has the form of a flat disc substantially corresponding in shape and size to the substrate W. At least on a top side, in an embodiment on both sides, the substrate holder has projections 106, commonly referred to as burls. In an embodiment, the substrate holder is an integral part of the substrate table and does not have burls on the lower surface. The burls are not shown to scale in FIG. 6. In a practical embodiment, there can be many hundreds of burls distributed across a substrate holder having a width (e.g., diameter) of, e.g., 200 mm, 300 mm or 450 mm. The tips of the burls have a small area, e.g. less than 1 mm$^2$, so that the total area of all of the burls on one side of the substrate holder 100 is less than about 10% of the total area of the total surface area of the substrate holder. In this way, there is a very high probability that any particle that might lie on the surface of the substrate, substrate holder or substrate table will fall between burls and will not therefore result in a deformation of the substrate or substrate holder. The arrangement of burls can be regular or can vary as desired to provide appropriate distribution of force on the substrate and/or substrate table. The burls can have any shape in plan but are commonly circular in plan. The burls can have the same shape and dimensions throughout their height but may be tapered. The burls can project a distance of from about 1 µm to about 5 mm, desirably from about 5 µm to about 250 µm, from the rest of the surface of the main body of the substrate holder 100a. The thickness of the main body 100a of the substrate holder 100 can be in the range of about 1 mm to about 50 mm, desirably in the range of about 5 mm to 20 mm, typically 10 mm.

In an embodiment of the invention, the substrate holder 100 is made of a rigid material. Desirably the material has a high thermal conductivity or a low coefficient of thermal expansion. A suitable material includes SIC (silicon carbide), SiSiC (siliconized silicon carbide), $Si_3N_4$ (silicon nitride), quartz, and/or various other ceramic and glass-ceramics, such as Zerodur® glass ceramic. SiSiC has a low electrical conductance. The substrate holder 100 can be manufactured by selectively removing material from a solid disc of the relevant material so as to leave the projecting burls. A suitable technique to remove material includes electrical discharge machining (EDM), etching, machining and/or laser ablation.

A heater and sensor can be used to locally control and/or monitor the temperature of the substrate so as to reduce undesired or induced desired temperature variation and stress in the substrate. It is desirable to control temperature and/or stress of the substrate in order to reduce or eliminate imaging errors such as overlay errors due to local expansion or contraction of the substrate. For example, in an immersion lithography apparatus, evaporation of residual immersion liquid (e.g., water) on the substrate may cause localized cooling and hence shrinkage of the substrate. Conversely, the energy delivered to the substrate by the projection beam during exposure can cause significant heating and therefore expansion of the substrate.

In an embodiment, one or more localized heaters 101 are controlled by controller 103 to provide a desired amount of heat to the substrate holder 100 and substrate W to control the temperature of the substrate W. One or more temperature sensors 102 are connected to controller 104 which monitors the temperature of the substrate holder 100 and/or substrate W. Voltage source 105 generates a potential difference e.g. of the order of 10 to 5,000 volts, between the substrate W and the substrate holder 100 and between the substrate holder 100 and the substrate table WT so that an electrostatic force clamps the substrate W, substrate holder 100 and substrate table WT together. In an embodiment, the potential difference is provided between an electrode on the lower surface of the substrate W and an electrode on the bottom of the recess in the substrate table WT. Arrangements using one or more heaters and temperature sensors to locally control the temperature of a substrate are described in U.S. patent application publication nos. US 2011-0222032 and 2011-0222033, each document is incorporated herein by reference in its entirety. The arrangements described therein can be modified to make use of a resistive heater and temperature sensor as described herein.

A thermal load acting on the substrate W can result in an undesirable deformation of the substrate W. One way to manage such a thermal load is by thermally conditioning the substrate holder 100. The substrate holder 100 and the substrate W are thermally connected to each other through the burls 106 and a gas layer between the main body surface 71 of the substrate holder 100 and the underside of the substrate W. Through this thermal connection, thermal conditioning of the substrate holder 100 results in thermal conditioning the substrate W. Heaters 101 and/or temperature sensors 102 can be used to thermally condition the substrate holder 100. Additionally or alternatively, the substrate holder 100 can be thermally conditioned via a heat transfer fluid flowing through the substrate holder 100. In an embodiment the heat transfer fluid comprises water. In an embodiment the heat transfer fluid comprises carbon dioxide.

The thermal connection between the substrate W and the substrate holder 100 is not ideal. A thermal load that acts on the substrate W can result in a temperature gradient between the substrate W and the substrate holder 100. As such if the substrate holder 100 is controlled to be at a desired temperature, then the temperature of the substrate W may be offset from that desired temperature. This offset from the desired temperature can correspond to an undesirable thermal deformation of the substrate W. This offset may be known as a thermal fingerprint.

In an embodiment of the invention, heaters 101 and/or temperature sensors 102 are used to thermally condition the substrate W directly. In an embodiment a heater 101 and/or a temperature sensor 102 is positioned between the main body surface 71 of the substrate holder 100 and the substrate W. In an embodiment the heater 101 and/or temperature sensor 102 forms a layer of a thin film stack. The thin film stack may be applied to the main body 100a of the substrate holder 100. The heater 101 and/or temperature sensor 102 can, in principle, be used as part of a thermal conditioning system for the substrate W and/or the substrate holder 100, because of its position between the two components.

In an embodiment the substrate holder 100 is configured such that when a substrate W is supported on the end surfaces 72 of the burls 106, a thermal conductance between the heater 101 (and/or temperature sensor 102) and the substrate W is greater than a thermal conductance between the heater 101 (and/or temperature sensor 102) and the main body surface 71. The heater 101 and/or temperature sensor 102 is thermally better connected to the substrate W than to the main body 100a of the substrate holder 100. This allows the heater 101 and/or temperature sensor 102 to thermally condition the substrate W more than the main body 100a of the substrate holder 100.

In an embodiment a ratio of the thermal conductance between the heater 101 (and/or temperature sensor 102) and the substrate W to the thermal conductance between the heater 101 (and/or the temperature sensor 102) and the main body surface 71 is greater than about 5:1. In an embodiment the ratio is greater than or equal to about 10:1. If the ratio is about 10:1, then approximately 90% of any heat emanating from a heater 101 is transferred to the substrate W, rather than to the substrate holder 100. Similarly, approximately 90% of the heat that reaches the temperature sensor 102 originates from the substrate W rather than the substrate holder 100. (Of course, this assumes that the substrate W and the substrate holder 100 are at approximately the same temperature.) In this case, the main body of the substrate holder 100a is substantially thermally decoupled from the heater 101 and/or the temperature sensor 102. This allows the substrate W to be thermally conditioned independently of the main body 100a of the substrate holder 100.

FIG. 7 depicts schematically in cross-section an embodiment of the invention. The substrate holder 100 comprises a thermally insulating layer 73. The thermally insulating layer 73 may be positioned between the heater 101 and/or temperature sensor 102 and the main body surface 71. The purpose of the thermally insulating layer 73 is to thermally decouple the heater 101 and/or temperature sensor 102 from the main body 100a of the substrate holder 100. By such decoupling, the thermal connection between the heater 101 and/or temperature sensor 102 and the substrate W relatively improves. This improves the performance of the heater 101 and/or temperature sensor 102 in thermally conditioning the substrate W directly. As will be described below, there are several other options for thermally decoupling the heater 101 and/or temperature sensor 102 from the main body 100a of the substrate holder 100. These options may be used in addition to each other or as alternatives to each other. In an embodiment, the thermally insulating layer 73 is formed of an aerogel, which is both electrically and thermally isolating. In this case an electrical isolation layer 74 may optionally be omitted provided that the thermally insulating layer 73 formed of aerogel provides sufficient electrical isolation.

As depicted in FIG. 7, the substrate holder 100 may comprise an electrical isolation layer 74 between the heater 101 and/or temperature sensor 102 and the main body surface 71 (e.g., main body 100a of the substrate holder 100). The purpose of the electrical isolation layer 74 is to electrically isolate the heater 101 and/or temperature sensor 102 from the main body 100a of the substrate holder 100. The electrical isolation layer 74 may have the additional effect of providing further thermal insulation between the main body surface 71 and the heater 101 and/or temperature sensor 102. In an embodiment, the electrical isolation layer 74 is formed of an aerogel, which is both electrically and thermally isolating. An advantage of such an electrical isolation layer is that it reduces the possibility of short-circuiting between the heater/sensor and the main body 100a of the substrate holder 100.

In an embodiment the electrical isolation layer 74 is formed of silicon dioxide. However, one or more other electrically insulating materials may be used as the electrical isolation layer 74. In an embodiment the thermally insulating layer 73 is formed of benzocyclobutene (BCB). However, one or more other materials with thermal insulation properties may also be used. BCB may be a particularly practical material to use for the thermally insulating layer 73 because BCB may be used in another layer of the substrate holder 100. For example, BCB may be used to form a planarization layer 108 to smooth out any roughness between the burls 106. In an embodiment, there may be a lower electrical isolation layer below the planarization layer 108. The lower electrical isolation layer may be positioned between the main body surface 71 and the planarization layer 108.

Figure 15:
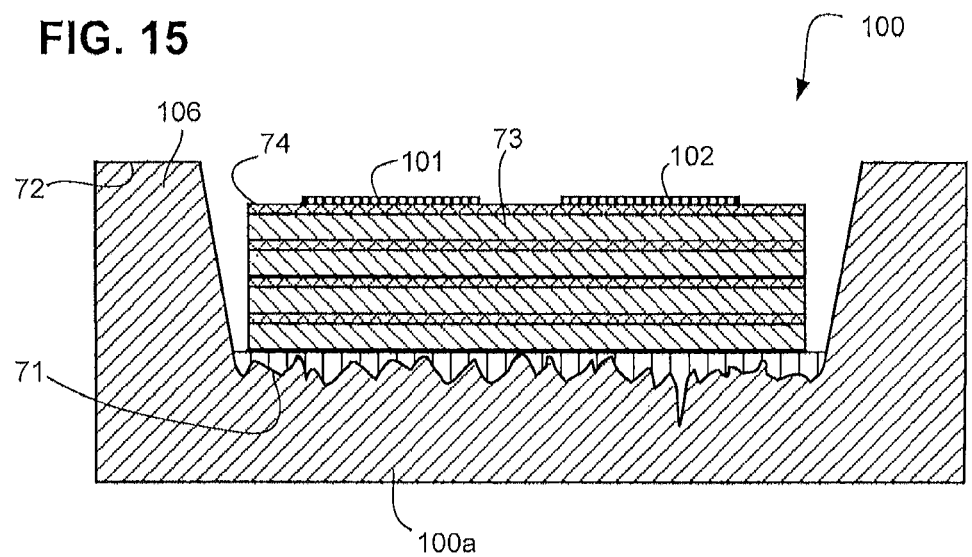
FIG. 15 depicts in cross-section a substrate holder according to an embodiment of the invention.

FIG. 15 depicts an embodiment in which the substrate holder 100 comprises a plurality of thermally insulating layers 73 and electrical isolation layers 74 between the main body surface 71 and the heater 101 and/or temperature sensor 102. For example the space between the main body surface 71 and the heater 101 and/or temperature sensor 102 may be filled mostly with a thermally insulating material punctuated by thin (e.g. micro) layers of an electrical isolation material. In an embodiment, microlayers of silicone dioxide may be separated by sections of BOB. A plurality of thinner electrical isolation layers has an advantage over a single thicker electrical isolation layer in that the plurality of thinner electrical isolation layers are less likely to break due to their relatively high rigidity.

Figure 8:
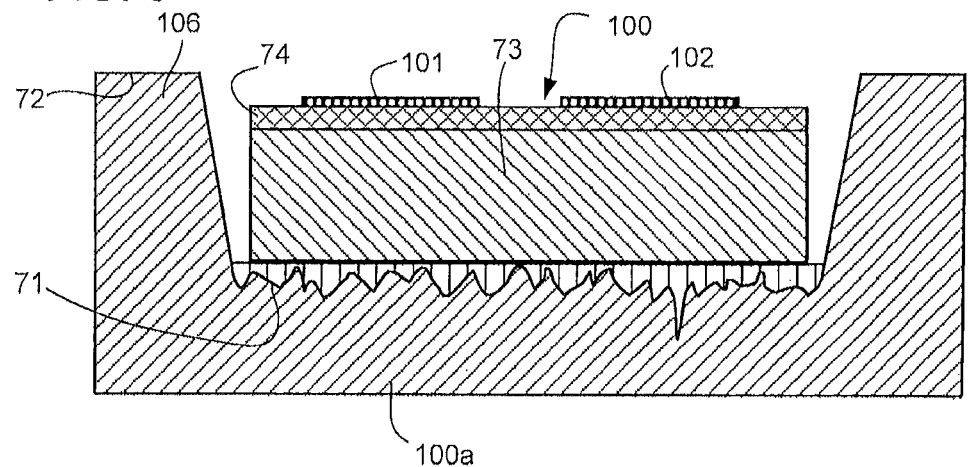
FIG. 8 depicts in cross-section a substrate holder according to an embodiment of the invention.

As depicted in FIG. 7, in an embodiment there may be a single thermally insulating layer 73 and a single electrical isolation layer 74. In this case as depicted in FIG. 7, the thermally insulating layer 73 may be positioned between the electrical isolation layer 74 and the heater 101 and/or temperature sensor 102. However, this need not be the case. For example, as depicted in FIG. 8, the electrical isolation layer 74 may be positioned between the thermally insulating layer 73 and the heater 101 and/or temperature sensor 102.

In an embodiment the substrate holder 100 is configured such that when a substrate W is supported on the end surfaces 72 of the burls 106, a distance d1 between the heater 101 and/or temperature sensor 102 and the main body surface 71 is greater than a distance d2 between the heater 101 and/or temperature sensor 102 and the substrate W. In an embodiment, the combined thickness of the thermally insulating layer 73 and the electrical isolation layer 74 is more than half of the total distance between the main body surface 71 and the substrate W. This relationship of distances helps to increase the relative thermal conductance between the substrate W and the heater 101 and/or temperature sensor 102 compared to the thermal conductance between the main body surface 71 and the heater 101 and/or temperature sensor 102.

In an embodiment, for example, the average thermal conductivity of materials in the space between the main body surface 71 and the heater 101 and/or temperature sensor 102 may be less than the average thermal conductivity of the material between the substrate W and the heater 101 and/or temperature sensor 102. In this case, it is possible for the heater 101 and/or temperature sensor 102 to be closer to the main body surface 71 than the substrate W, while still having greater heat transfer to/from the substrate W than to/from the main body surface 71.

In an embodiment, in a direction perpendicular to the main body surface 71, a ratio of a distance d2 between the heater 101 and/or temperature sensor 102 and the end surfaces 72 of the burls 106 to a distance d3 between the main body surface 71 and the end surfaces 72 of the burls 106 is less than or equal to about 1:15. The thermal conductivity of the space between the substrate W and the heater 101 and/or temperature sensor 102 is inverse to the thickness d2 of this space. By providing the ratio of 1:15, heat transfer between the substrate W and the heater 101 and/or temperature sensor 102 is relatively increased compared to to/from the substrate holder 100.

In an embodiment the distance d3 between the main body surface 71 and the end surfaces 72 of the burls 106 is in the range of from about 100 micrometers to about 200 micrometers. In an embodiment the distance d3 is about 150 micrometers. In this case, the ratio of 1:15 provides that the distance d2 between the substrate W and the heater 101 and/or temperature sensor 102 is less than or equal to about 10 micrometers. This provides good thermal connection between the substrate W and the heater 101 and/or temperature sensor 102. This ratio of 1:15 may provide that the thermal conductance to/from the substrate W is 10 times greater than the thermal conductance to/from the main body surface 71, where the gas below the substrate W is air. This can allow the substrate W to be thermally conditioned independently from the main body 100a of the substrate holder 100.

In an embodiment the distance d2 is greater than or equal to about 1 micrometer. The minimum distance for d2 is preferable to help ensure that the end surfaces 72 of the burls 106 remain the highest point of the substrate holder 100. This helps to ensure that the substrate W is always supported on the same end surfaces 72 of the burls 106, rather than by an undesirably rough or mal-positioned layer of the thin film stack in which the heater 101 and/or temperature sensor 102 is positioned.

In an embodiment, the thickness of the heater 101 and/or temperature sensor 102 is in the range of from about 150 nanometers to about 250 nanometers, and desirably about 200 nanometers.

In an embodiment the main body 100a of the substrate holder 100 is substantially formed of a glass-ceramic, such as Zerodur®. A glass-ceramic such as Zerodur® has a relatively low thermal conductivity. As such, the heat transfer rate between the main body surface 71 and the heater 101 and/or the temperature sensor 102 is relatively decreased compared to the case where the main body 100a of the substrate holder 100 is formed of a material having a higher thermal conductivity. The use of a glass-ceramic for the substrate holder 100 desirably reduces the thermal connection between the substrate holder and the heater 101 and/or temperature sensor 102. Planarization layer 108 is optional. For example, if the main body 100a of the substrate holder 100 is formed of a glass-ceramic such as Zerodur®; then the planarization layer 108 may not be necessary. This is because a surface of a glass-ceramic such as Zerodur® may be sufficiently planar without the planarization layer 108.

However, other materials for the main body 100a of the substrate holder 100 may be used. For example siliconized silicon carbide (SiSiC) may be used to form the main body 100a of the substrate holder 100. SiSiC has a higher thermal conductivity than a glass-ceramic such as Zerodur®. In this case, the thermally insulating layer 73 is effective to thermally decouple the main body surface 71 from the heater 101 and/or temperature sensor 102. As will be explained below, further ways of increasing thermal decoupling are possible.

Figure 9:
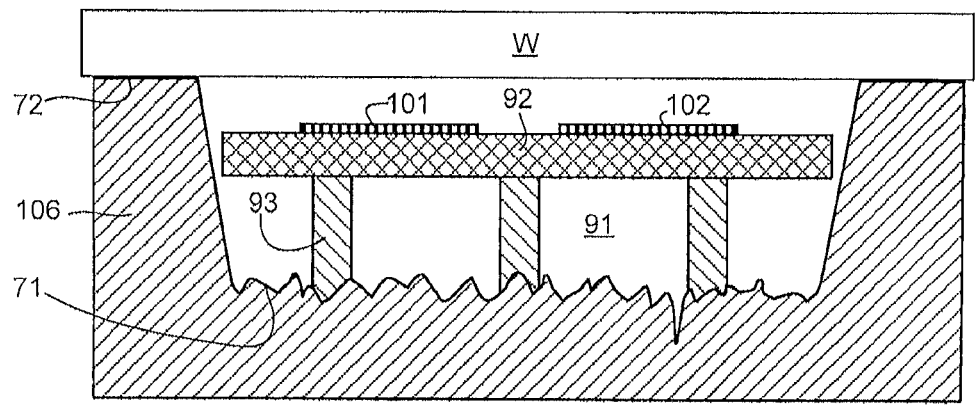
FIG. 9 depicts in cross-section a substrate holder according to an embodiment of the invention.

FIG. 9 depicts schematically in cross-section an embodiment of the invention. FIG. 9 depicts an embodiment in which a thermally insulating layer comprising a gap is positioned between the main body surface 71 and the heater 101 and/or temperature sensor 102. The gap thermally decouples the main body 100a of the substrate holder 100 from the heater 101 and/or temperature sensor 102. However, for example as depicted in FIG. 7 and in FIG. 8, in an embodiment there is no gap between the main body surface 71 and the heater 101 and/or temperature sensor 102. As depicted in FIG. 9, the planarization layer may optionally be omitted. An advantage of this is that it simplifies construction of the substrate holder 100. The characteristic of a planar surface is less important when the layer immediately above the main body surface 71 is substantially a gap 91. However, in an embodiment, the planarization layer 108 is provided.

In an embodiment the gap 91 is substantially filled with a gas. The gas may be, for example, air or nitrogen. Other types of gas may be used to fill the gap 91. Desirably the gas in the gap 91 has a relatively low thermal conductivity so as to increase the relative thermal conductance between the substrate W and the heater 101 and/or temperature sensor 102.

As depicted in FIG. 9 the heater 101 and/or temperature sensor 102 may be positioned on a thermal interface plate 92. The thermal interface plate allows the heater 101 and/or temperature sensor 102 to be positioned distal from the main body 100a of the substrate holder 100. The heater 101 and/or temperature sensor 102 may be deposited on the thermal interface plate 92 before the assembly of the thermal interface plate 92 and the heater 101 and/or temperature sensor 102 is attached to the main body 100a of the substrate holder 100. An advantage of depositing the heater 101 and/or temperature sensor 102 directly onto a thermal interface plate 92 is that the material of the thermal interface plate 92 may be chosen such that it has a surface that is smoother than the main body surface 71 of the substrate holder 100. The term smoother here means that the peak to valley distance on the surface of the thermal interface plate 92 is less than the peak to valley distance on the main body surface 71 of the substrate holder 100. Hence by use of the thermal interface plate 92, it may be more convenient to produce a planar system of heaters 101 and/or temperature sensors 102.

In an embodiment the thermal interface plate 92 is porous and/or perforated. An advantage of this is that the thermal interface plate 92 may comprise pockets of gas, which increase the thermal insulation between the main body surface 71 and the heater 101 and/or temperature sensor 102. An advantage of a porous and/or perforated thermal interface plate 92 is that gas layers above and below the thermal interface plate 92 are connected to each other, which improves the evacuation time (or clamp time) of both gaps. Both gaps can be evacuated from one gap only. For example, in an embodiment either gap may be evacuated via an extraction point in the main body 100a that is in fluid communication with the bottom gap. Another advantage of a porous and/or perforated thermal interface plate 92 is that the holes help to equalize the pressure above and below the thermal interface plate 92.

In an embodiment the substrate holder 100 is manufactured by connecting the thermal interface plate 92 to the main body 100a of the substrate holder 100. This connection may be irreversible, for example by using an adhesive. This has an advantage that the thermal interface plate 92 is less likely to become dislodged undesirably during use.

Alternatively, this connection may be reversible such that the thermal interface plate 92 can be removed from the main body 100a of the substrate holder 100 after connection. This reversible type of connection has an advantage that the system of heaters 101 and/or temperature sensor 102 of the substrate holder 100 can be replaced more easily by replacing the thermal interface plate 92 that has the one or more heaters 101 and/or temperature sensors 102 deposited thereon. Such a reversible connection may be achieved by connecting the thermal interface plate 92 to the main body 100a of the substrate holder 100 by projections from an undersurface of the thermal interface plate 92, such as burls 93 or bolts.

FIG. 9 depicts an embodiment in which burls 93 connect the thermal interface plate 92 to the main body 100a of the substrate holder 100. The number and arrangement of the burls 93 is not particularly limited. In an embodiment the burls 93 or bolts constitute less than 10% of the volume of the gap 91. The gap 91 is substantially filled with a gas, or is substantially empty. In an embodiment the burls 93 or bolts constitute more than 10% of the volume of the gap 91. In this case the burls 93 or bolts may have a low conductance. For example, the burls 93 or bolts may be formed of a porous glass or BCB.

In an embodiment the thermal interface plate 92 is connected to the main body 100a of the substrate holder 100 via a frictional engagement between the thermal interface plate 92 and side edges of the burls 106 of the substrate holder 100. For example, the thermal interface plate 92 may comprise no burls 93 or bolts. In an embodiment the thermal interface plate 92 comprises a pattern of holes that correspond to the pattern of burls 106 of the substrate holder 100. A width (e.g., diameter) of the holes in the thermal interface plate 92 corresponds to a width (e.g., diameter) of the burls 106. The burls 106 may have a tapered shape such that a maximum width (e.g., diameter) of the burls 106 is at the point at which the burls 106 connect to the main body 100a of the substrate holder 100. A minimum width (e.g., diameter) of the burls 106 may be at the end surfaces 72 of the burls 106. The holes in the thermal interface plate 92 may have a width that is less than the maximum width of the burls 106 and greater than the minimum width at the end surfaces 72 of the burls 106. When the thermal interface plate 92 is connected to the main body 100a of the substrate holder 100, the burls 106 extend through the holes until a frictional engagement is formed. In an embodiment the thermal interface plate 92 is glued to or clipped onto the burls 106 of the substrate holder 100. In an embodiment a planarization layer 108 is not present. If a gap 91 is immediately above the main body surface 71, then a planarization layer may not be present because the main body surface 71 can be rough.

In an embodiment the thermal interface plate 92 is connected to the main body 100a of the substrate holder 100 so as to form a gas seal around the gap 91. In this way, a gas, such as air or nitrogen, can be trapped in the gap 91 during assembly of the substrate holder 100.

In an embodiment the gap 91 is not filled with a gas. For example in an immersion lithographic system, the gap 91 may be filled with an immersion fluid. As a further example, in an EUV lithographic system, the gap 91 may be substantially at a vacuum. However, if desired, gas may be trapped in the gap 91 by forming a gas seal as described above.

As depicted in FIG. 9 there may be a region of gas between the substrate W and the heater 101 and/or temperature sensor 102. As described above, optionally the heater 101 and/or temperature sensor 102 is closer to the substrate W than the main body surface 71. The thermal insulation that thermally decouples the substrate holder 100 from the heater 101 and/or temperature sensor 102 is provided by the combination of the gap 91 and the thermal interface plate 92.

In an embodiment the thermal interface plate 92 has a thickness of at least one fifth of the distance d3 between the main body surface 71 and the end surfaces 72 of the burls 106. However, for example, the thermal insulation may be provided by the gap 91 such that the thermal interface plate 92 is not required to have a minimum thickness so as to provide thermal insulation. The thermal interface plate 92 may be formed of a rigid continuous solid material. In an embodiment the thermal interface plate 92 is formed of a material selected from the group consisting of silicon, glass-ceramic such as Zerodur®, cordierite and metal. An advantage of using silicon or metal is that it is easier to provide a smooth surface on which to deposit the heater 101 and/or temperature sensor 102. An advantage of using a glass-ceramic such as Zerodur® is that the thermal interface plate 92 electrically isolates the main body 100a of the substrate holder 100 from the heater 101 and/or temperature sensor 102.

In an embodiment the material from which the thermal interface plate 92 is formed is an electrical insulator. This has an advantage of electrically isolating the heater 101 and/or temperature sensor 102 from the main body surface 71. However, the electrical isolation may additionally or alternatively be achieved by the gap 91 and optionally the burls 93 or bolts.

In an embodiment burls 93 of the thermal interface plate 92 or bolts are formed of the same material as that from which the main body 100a of the substrate holder 100 is formed. Alternatively or additionally, burls 93 and/or bolts may be formed of the same material as the thermal interface plate 92. In an embodiment burls 93 and/or bolts are formed of an electrically insulating material such as a glass-ceramic such as Zerodur®.

In an embodiment, in a direction perpendicular to the main body surface 71, a ratio of a distance d2 between the end surfaces 72 of the burls 106 and the heater 101 and/or temperature sensor 102 to a distance d1 between the main body surface 71 and the heater 101 and/or temperature sensor 102 is less than or equal to 1:1. The smaller this ratio, the greater the proportion of heat that is transferred to/from the substrate W rather than to/from the main body 100a of the substrate holder 100. In an embodiment the ratio of distance d2 to distance d1 is less than or equal to about 1:5, and optionally less than or equal to about 1:10. If the ratio is about 1:10, then about nine tenths of the total heat transfer to/from the heater 101 and/or temperature sensor 102 is to/from the substrate W. The gap 91 can provide better thermal insulation than a layer of solid material. Hence if the gap 91 is present then the ratio of distance d2 to distance d1 can be relatively greater while still achieving satisfactory thermal decoupling between the main body 100a of the substrate holder 100 and the heater 101 and/or temperature sensor 102. In an embodiment, in a direction perpendicular to the main body surface 71, a ratio of a distance d2 between the end surfaces 72 of the burls 106 and the heater 101 and/or temperature sensor 102 to a distance d3 between the main body surface 71 and the end surfaces 72 is less than or equal to about 1:3. For example, the distance between the substrate W and the heater 101 and/or temperature sensor 102 is optionally less than or equal to about 50 micrometers. In this case, the combined thermal insulation provided by the thermal interface plate 92 and the gap 91 may provide that about 90% of heat emanating from a heater 101 reaches the substrate W, rather than the main body surface 71, even where the space between the substrate W and the heater 101 and/or temperature sensor 102 is filled with air.

In an embodiment the distance between the substrate W and the heater 101 and/or temperature sensor 102 may be significantly less than 50 micrometers, for example less than 20 micrometers and optionally about 10 micrometers. This allows the thickness of the gap 91 to be greater, without increasing the overall distance d3 between the main body surface 71 and the substrate W. In an embodiment, in a direction perpendicular to the main body surface 71, a ratio of a thickness of the gap 91 to a distance between the main body surface 71 and the end surfaces 72 is greater than or equal to about 2:5, and optionally greater than or equal to about 2:3. In the case that the ratio is about 2:3 or greater, most of the distance between the main body surface 71 and the substrate W is taken up by the gap 91. This provides a good thermal insulation between the main body surface 71 and the heater 101 and/or temperature sensor 102. In the case that the gap 91 is a vacuum, for example, the thickness of the gap 91 may be smaller, for example in the region of about 2:5 as a ratio of the distance d3 between the main body surface 71 and the substrate W.

Figure 10:
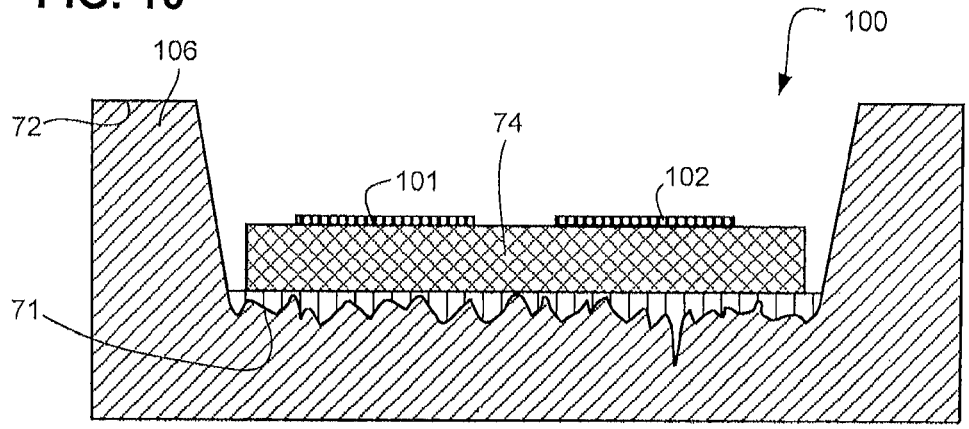
FIG. 10 depicts in cross-section a substrate holder according to an embodiment of the invention.

FIG. 10 depicts schematically in cross-section an embodiment of the invention. As depicted in FIG. 10 in an embodiment the substrate holder 100 comprises an electrical isolation layer 74 between the main body surface 71 and the heater 101 and/or temperature sensor 102. In an embodiment the electrical isolation layer 74 is substantially the only layer between the main body surface 71 and the heater 101 and/or temperature sensor 102. This means that apart from a possible planarization layer 108, the region between the main body 100a and the heater 101 and/or temperature sensor 102 is filled by a single integral electrical isolation layer 74. This has an advantage of a relatively simple structure such that the manufacture of the substrate holder 100 is made easier.

In order to thermally decouple the main body 100a from the heater 101 and/or temperature sensor 102, a ratio of a thickness of the electrical isolation layer 74 to a distance between the main body surface 71 and the end surfaces 72 of the burls 106 is greater than or equal to about 2:5. For example, a thickness of the electrical isolation layer 74 is greater than or equal to about 60 micrometers. In an embodiment the electrical isolation layer 74 is formed of silicon dioxide. In an embodiment, a ratio of a thickness of the electrical isolation layer 74 to a distance between the end surfaces 72 of the burls 106 and the heater 101 and/or temperature sensor 102 is greater than 1:1, optionally greater than or equal to about 10:1 and optionally greater than or equal to about 50:1. The greater the thermal conductance of the material of the electrical isolation layer 74, the greater this ratio should be. For example, silicon dioxide has a thermal conductivity that is of the order of 100 times greater than the thermal conductivity of air, which may be present between the substrate W and the heater 101 and/or temperature sensor 102. In this case a high ratio of distance d1 to distance d2 may be required. In an embodiment a distance d3 between the main body surface 71 and the end surfaces 72 of the burls 106 is about 150 µm.

Figure 11:
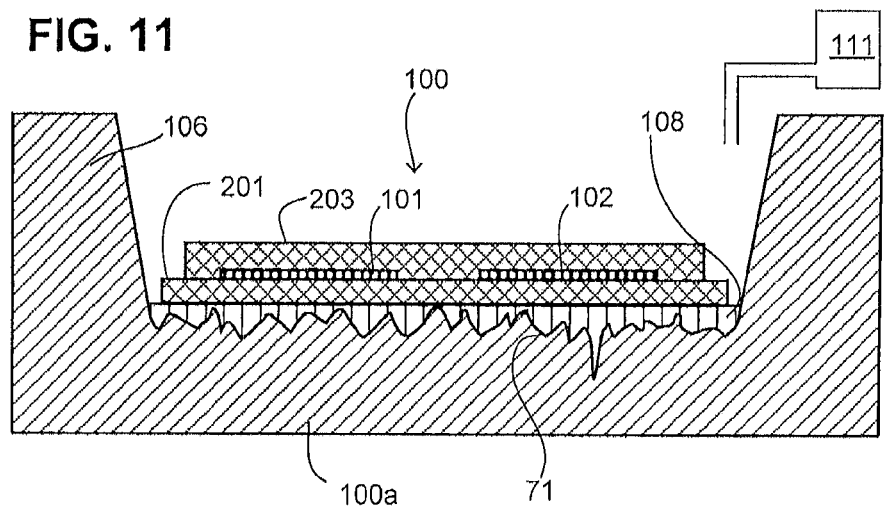
FIG. 11 depicts in cross-section a substrate holder according to an embodiment of the invention.

FIG. 11 depicts in cross-section a substrate holder 100 according to an embodiment of the invention. This embodiment has a planarization layer 108 which may be applied to any of the embodiments described above or below. In an embodiment the planarization layer 108 is formed of BCB. The heater 101 and/or temperature sensor 102 is formed as a layer in a thin film stack. The thin film stack comprises a first isolation layer 201 and a second isolation layer 203 sandwiching between them the heater 101 and/or temperature sensor 102. The second isolation layer 203 is positioned between the substrate W and the heater 101 and/or temperature sensor 102. Such a second isolation layer 203 may be applied to any of the embodiments described above or below.

Instead of, or as well as using a planarization layer 108, the surface between the burls 106 may be ground until it is sufficiently flat to apply the first isolation layer 201. As described above, the region between the main body surface 71 and the heater 101 and/or temperature sensor 102 may comprise a plurality of layers formed of a glass like material such as silicon dioxide or Zerodur®. However, desirably the layers of glass like material are kept to a minimum so as to reduce the possibility of such layers cracking due to their stiffness.

Figure 14:
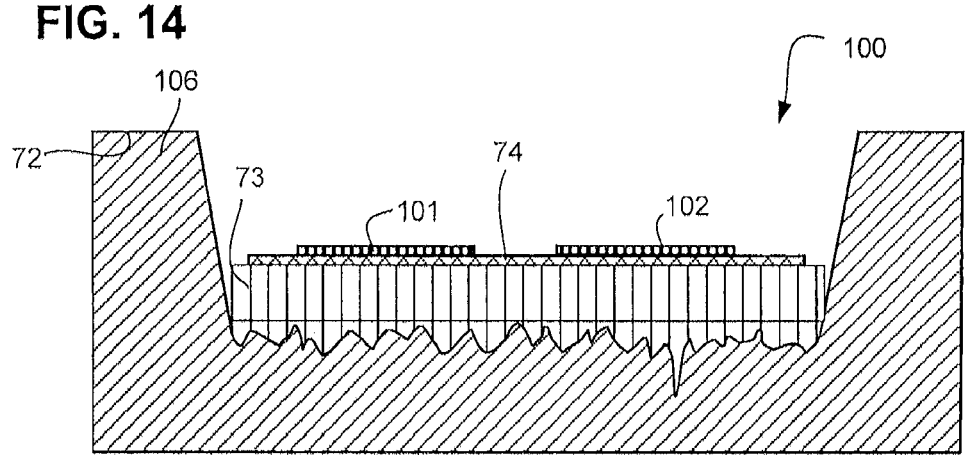
FIG. 14 depicts in cross-section a substrate holder according to an embodiment of the invention.

In an embodiment in order to increase the thermal insulation between the main body surface 71 and the heater 101 and/or temperature sensor 102, a thickness of the planarization layer 108 is increased. This is depicted in FIG. 14 in which there is depicted a thin electrical isolation layer 74. The thickness of the planarization layer 108 is increased so as to provide thermal insulation.

For thermal conditioning of the substrate W using the system of heaters 101 and/or temperature sensors 102, the heat transfer coefficient of the burls 106 of the substrate holder 100 and the heat transfer coefficient of gas between the substrate W and the heater 101 and/or temperature sensors 102 is of significance. In an embodiment a lithographic apparatus that comprises a substrate holder 100 according to an embodiment of the present invention further comprises a fluid outlet 111 that is configured to fill the gap between the substrate W and the heater 101 and/or temperature sensor 102. The fluid outlet 111 is configured to fill the gap with a gas that has a higher thermal conductivity than air. In an embodiment the gas is hydrogen or helium, for example. One or more additional or alternative gases, liquids or soft materials may be used. The fluid outlet 111 can be used both for extraction and supply of fluid. In an embodiment the fluid outlet 111 forms part of the main body 100a of the substrate holder 100. In an embodiment there is provided a plurality of such fluid outlets 111.

An advantage of using hydrogen is that a hydrogen source may be used elsewhere in the lithographic apparatus. For example, hydrogen may be used elsewhere in an EUV lithographic apparatus. An advantage of using helium is that it is not flammable. Helium is inert, meaning it does not react and is not hazardous by itself. In an embodiment the gap 91 is isolated from the region between the substrate W and the heater 101 and/or temperature sensor 102. Here, isolation means that there is no fluid communication between the gap 91 and the region. In an embodiment a gas in the gap 91 is different from a gas in the region. In an embodiment the gas in the gap 91 has a lower thermal conductivity than that of a gas in the region.

In an embodiment the substrate holder 100 is integrated into a substrate table WT. However, in an embodiment, the substrate holder 100 is separable from the substrate table WT of the lithographic apparatus.

Figure 12:
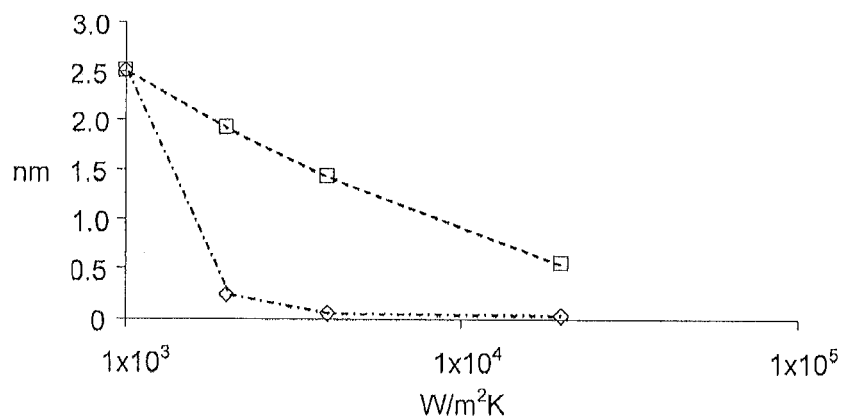
FIG. 12 is a graph showing the effectiveness of an embodiment of the invention.

FIG. 12 depicts a graph that shows the potential of a system of heaters 101 and/or temperature sensors 102 to decrease an undesirable thermal fingerprint that results from undesirable thermal loads in lithographic systems. The data for FIG. 12 relates to an immersion lithographic system with a 2W thermal load provided by the fluid handling structure 12. FIG. 12 shows an expected maximum deformation under the middle of a fluid handling structure 12 of an immersion lithographic apparatus during a scanning operation. The results are based on a 2D thermo-mechanical model.

The thermal conductivity of the burls 106 of the substrate holder 100 is taken to be 1000 W/m²K. The thermal conductivity of the gas between the substrate W and the heater 101 and/or temperature sensor 102 is varied so as to provide the overall thermal conductivity indicated on the X axis.

The squares show the thermal fingerprint for a substrate holder 100 that is maintained at the desired temperature. In case of nearly complete thermal decoupling between the heater 101 and/or temperature sensor 102 and the substrate holder 100, the substrate holder 100 may be thermally conditioned using different means. The thermal decoupling has an advantage that most of the thermal loads acting on the substrate are already compensated for on the substrate W. Only a fraction of these thermal loads will influence the substrate holder 100. The requirements for thermal conditioning of the substrate holder 100 are reduced.

For example, the substrate holder 100 may be kept at a desired temperature by a thermal conditioning system that is separate from the heaters 101 and/or temperature sensors 102. In an embodiment the substrate holder 100 comprises a passage to allow the passage of a thermal conditioning fluid therethrough to thermally condition the substrate holder 100. In an embodiment the substrate holder 100 may be thermally conditioned independently from the thermal conditioning of the substrate W. In an embodiment the substrate holder 100 may be thermally conditioned by a set of heaters and/or temperature sensors that are separate from the one or more heaters 101 and/or temperature sensors 102 that thermally condition the substrate W as described above. The heaters and/or temperature sensors that thermally condition the substrate holder 100 may be positioned on an underside of the substrate holder 100 (that is the side opposite the side on which heater 101 and/or temperature sensor 102 is positioned) and/or inside the substrate holder 100 and/or on the bottom of the thermal interface plate 92. In an embodiment the thermal interface plate 92 has a set of heaters and/or temperature sensors on both sides of the thermal interface plate 92: one set to thermally condition the substrate W and one set to thermally condition the main body 100a of the substrate holder 100.

In FIG. 12, the thermal fingerprint is a result of the offset between the temperature of the substrate W and the temperature of the substrate holder 100, which is maintained at the desired temperature. The diamonds show the expected remaining thermal fingerprint when a system of heaters 101 and temperature sensors 102 is provided to thermally condition the substrate W, where the thermal conductivity to the substrate holder 100 is reduced in accordance to an embodiment of the present invention.

As can be seen from FIG. 12, there is a dramatic reduction in the undesirable fingerprint provided that heat transfers relatively efficiently between the substrate W and the heater 101 and/or temperature sensor 102. As described above, an embodiment of the present invention provides several different options that can be used independently of each other or in addition to each other in order to increase the relative thermal conductivity between the substrate W and the heater 101 and/or temperature sensor 102.

For the data points on the left (i.e. on the Y-axis), the gas conductance is zero and therefore direct substrate W conditioning is not possible. For other points, direct substrate temperature conditioning is functional and strongly decreases deformation.

Figure 13:
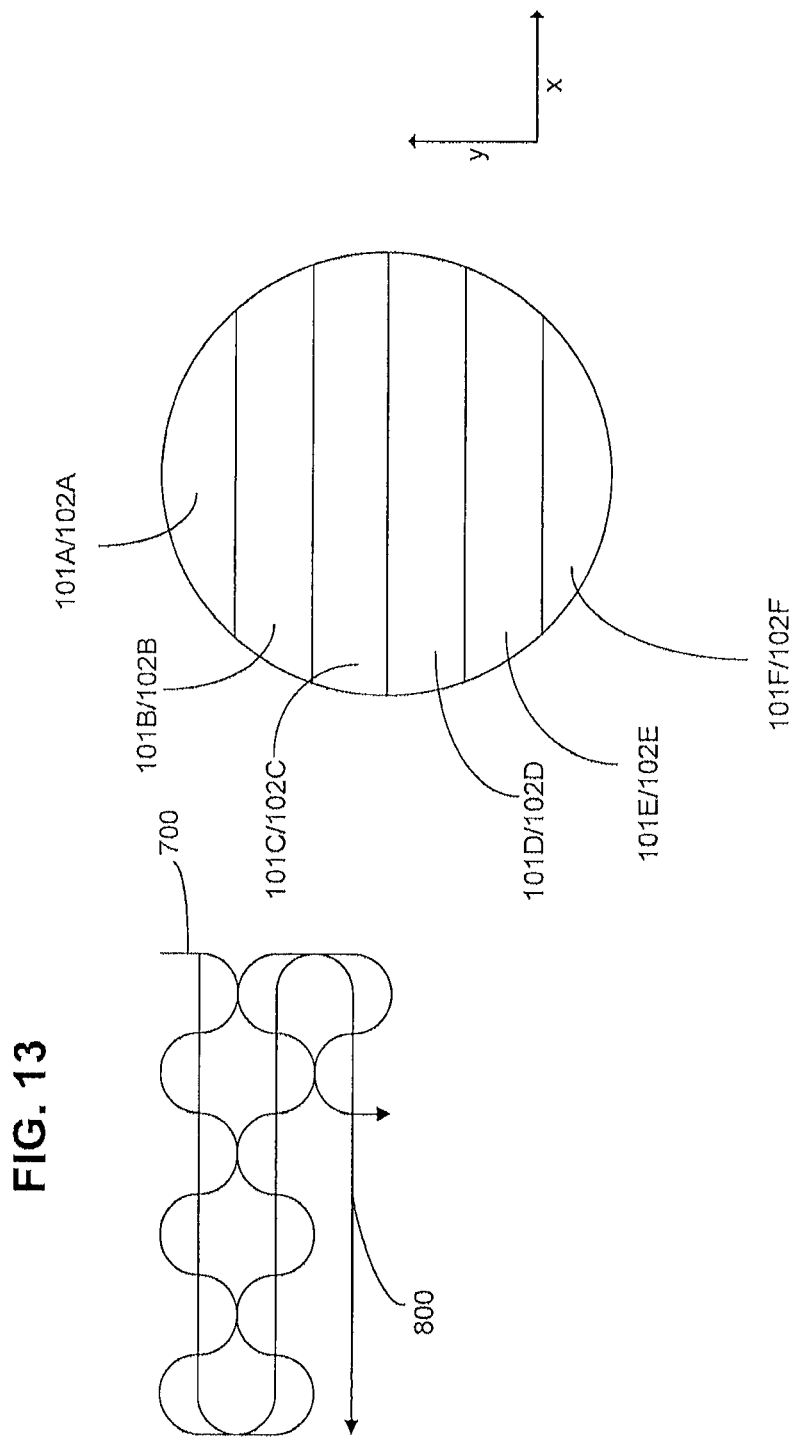
FIG. 13 depicts, in plan, an embodiment and also illustrates a meander path which the substrate support may take under the projection system.

FIG. 13 illustrates, in plan, an embodiment of the invention. As depicted in FIG. 13, in an embodiment the substrate holder 100 comprises a plurality of the heaters 101 and/or temperature sensors 102. The plurality of heaters 101A-F and/or temperature sensors 102A-F are elongated. They are substantially parallel in the elongate direction and extend across the substrate supporting area of the substrate holder 100 from one edge to an opposite edge. By providing a plurality of heaters 101 and/or temperature sensors 102, there is an advantage that thermal loads can be compensated more locally. However, the greater the number of heaters 101 and/or temperature sensors 102, the greater the number of thermal connections. From this trade-off, in an embodiment the substrate holder 100 comprises at least three, or at least five heaters 101 and/or temperature sensors 102. In an embodiment the substrate holder 100 comprises at most ten, and optionally at most eight heaters 101 and/or temperature sensors 102. The embodiment depicted in FIG. 13 comprises six heaters 101 and/or temperature sensors.

The numbers of heaters 101 and/or temperature sensors 102 may be selected so as to approximately scale with a width (e.g., diameter) of the substrate holder 100. For a substrate holder 100 having a width (e.g., diameter) of about 450 mm, there may be, for example about 10 segments of heaters 101 and/or temperature sensors 102. The embodiment depicted in FIG. 13 is a substrate holder 100 having a width (e.g., diameter) of about 300 mm.

Also illustrated in FIG. 13 is a meander path 700 which the substrate holder 100 takes under the projection system PS. The general overall motion of the meander path is illustrated by line 800.

As can be seen by comparing line 700 and line 800, while following the general path 800, moving backwards and forwards in the X direction takes place. Scanning in the Y direction is very fast. As a result, it can be seen that the substrate holder 100 moves fairly slowly from the top of the substrate (as illustrated) down to the bottom of the substrate along the Y direction. For this reason the heaters and/or temperature sensors 101A-F, 102A-F (and edge heaters and/or temperature sensors) are elongate in the X direction. The heaters and/or temperature sensors are elongate in a first direction. The first direction is orientated such that the length of time a given heater and/or temperature sensor 101, 102 stays under the projection system during imaging of the substrate W is greater than if the heater and/or sensor were orientated with its elongate direction perpendicular to the first direction (in which case it would be passed over several separate times during imaging of the whole substrate). In particular, in an embodiment, the time that a given heater and/or temperature sensor is under the projection system during imaging of the substrate is substantially minimized. In one embodiment this is done by ensuring that the elongate direction of the heaters and/or temperature sensors is substantially parallel with the scanning direction. However, other geometries may be more suitable for different scanning patterns. Thus, during imaging, the substrate steps in the X direction along the top heater/temperature sensor 101A/102A while scanning in the Y direction. This results in the area at the top of the substrate receiving a heat load and this is sensed and compensated for by the top heater and temperature sensor combination 101A/102A. The substrate then moves in the Y direction to move the second heater/temperature sensor combination 101B/102B under the projection system and scans in the Y direction. The heat load is concentrated at that Y position and the sensor/heater combination 101B/102B compensates accordingly. While stepping in the X direction a heat load is concentrated in that X direction. In positions along the Y axis away from the projection system, little heat load will be present. In an embodiment the heater 101 and/or temperature sensor 102 follows a tortuous path. However, in an embodiment, for example, the heater 101 and/or temperature sensor 102 may be substantially linear. The shape of the heater 101 and/or temperature sensor 102 is in general not particularly limited.

In an embodiment, there is provided a substrate holder for use in a lithographic apparatus, the substrate holder comprising: a main body having a surface; a plurality of burls projecting from the surface and having end surfaces to support a substrate; and a heater and/or a temperature sensor, on the main body surface, wherein when a substrate is supported on the end surfaces, a thermal conductance between the heater and/or temperature sensor and the substrate is greater than a thermal conductance between the heater and/or temperature sensor and the main body surface.

In an embodiment, a ratio of the thermal conductance between the heater and/or temperature sensor and the substrate to the thermal conductance between the heater and/or temperature sensor and the main body surface is greater than about 5:1, or greater than or equal to about 10:1.

In an embodiment, there is provided a substrate holder for use in a lithographic apparatus, the substrate holder comprising: a main body having a surface; a plurality of burls projecting from the surface and having end surfaces to support a substrate; and a heater and/or a temperature sensor, on the main body surface, wherein when a substrate is supported on the end surfaces, a distance between the heater and/or temperature sensor and the main body surface is greater than a distance between the heater and/or temperature sensor and the substrate.

In an embodiment, the substrate holder comprises a thermally insulating layer between the heater and/or temperature sensor and the main body surface. In an embodiment, the thermally insulating layer electrically isolates the heater and/ or temperature sensor from the main body surface. In an embodiment, a gap is located between the heater and/or temperature sensor and the main body surface. In an embodiment, the gap is substantially filled with a gas or the gap is substantially a vacuum gap. In an embodiment, in a direction perpendicular to the main body surface, a ratio of a thickness of the gap to a distance between the main body surface and the end surfaces is greater than or equal to about 2:5, or greater than or equal to about 2:3. In an embodiment, the heater and/or temperature sensor is provided on a thermal interface plate distal from the main body surface. In an embodiment, the thermal interface plate is porous and/or perforated. In an embodiment, the thermal interface plate is connected to the main body by an adhesive and/or by a projection from an undersurface of the thermal interface plate. In an embodiment, the substrate holder comprises an electrical isolation layer between the heater and/or temperature sensor and the main body surface. In an embodiment, in a direction perpendicular to the main body surface, a ratio of a thickness of the electrical isolation layer to a distance between the main body surface and the end surfaces is greater than or equal to about 2:5. In an embodiment, in a direction perpendicular to the main body surface, a ratio of a distance between the heater and/or temperature sensor and the end surfaces to a distance between the main body surface and the end surfaces is less than or equal to about 1:3 or less than or equal to about 1:15. In an embodiment, in a direction perpendicular to the main body surface, a distance between the main body surface and the end surfaces is in the range of from about 1 µm to about 5 mm, or desirably about 150 µm. In an embodiment, the main body is substantially formed of a glass-ceramic. In an embodiment, the substrate holder comprises a passage to allow passage of a thermal conditioning fluid therethrough to thermally condition the substrate holder. In an embodiment, the heater and/or temperature sensor is formed, in plan, as a line following a tortuous path. In an embodiment, the heater and/or temperature sensor extends across a substrate supporting area of the substrate holder from one edge to an opposite edge. In an embodiment, the substrate holder comprises a plurality of the heaters and/or temperature sensors.

In an embodiment, there is provided a lithographic apparatus, comprising: a projection system arranged to project a beam patterned by a patterning device onto a substrate; and a substrate holder arranged to hold the substrate, the substrate holder being as described herein.

In an embodiment, there is provided a lithographic apparatus, comprising: a substrate holder arranged to hold a substrate, the substrate holder being as described herein; and a fluid outlet configured to fill a gap between a bottom surface of the substrate and the heater and/or temperature sensor with a gas having a higher thermal conductivity than air, wherein desirably the gas is hydrogen or helium.

In an embodiment, the lithographic apparatus further comprises a substrate table, wherein the substrate holder is integrated into the substrate table.

In an embodiment, there is provided a device manufacturing method using a lithographic apparatus, the method comprising: projecting a beam patterned by a patterning device onto a substrate while holding the substrate on a substrate holder, the substrate holder comprising: a main body having a surface, a plurality of burls projecting from the surface and having end surfaces supporting the substrate, and a heater and/or a temperature sensor, on the main body surface, wherein a thermal conductance between the heater and/or temperature sensor and the substrate is greater than a thermal conductance between the heater and/or temperature sensor and the main body surface.

In an embodiment, there is provided a device manufacturing method using a lithographic apparatus, the method comprising: projecting a beam patterned by a patterning device onto a substrate while holding the substrate on a substrate holder, the substrate holder comprising: a main body having a surface, a plurality of burls projecting from the surface and having end surfaces supporting the substrate, and a heater and/or a temperature sensor, on the main body surface, wherein a distance between the heater and/or temperature sensor and the main body surface is greater than a distance between the heater and/or temperature sensor and the substrate.

As will be appreciated, any of the above described features can be used with any other feature and it is not only those combinations explicitly described which are covered in this application.

Although specific reference may be made in this text to the use of lithographic apparatus in the manufacture of ICs, it should be understood that the lithographic apparatus described herein may have other applications in manufacturing components with microscale, or even nanoscale features, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of or about 365, 248, 193, 157 or 126 nm). The term "lens", where the context allows, may refer to any one or combination of various types of optical components, including refractive and reflective optical components.

While specific embodiments of the invention have been described above, it will be appreciated that the invention may be practiced otherwise than as described. For example, the embodiments of the invention may take the form of a computer program containing one or more sequences of machine-readable instructions describing a method as disclosed above, or a data storage medium (e.g. semiconductor memory, magnetic or optical disk) having such a computer program stored therein. Further, the machine readable instruction may be embodied in two or more computer programs. The two or more computer programs may be stored on one or more different memories and/or data storage media.

The controllers described above may have any suitable configuration for receiving, processing, and sending signals. For example, each controller may include one or more processors for executing the computer programs that include machine-readable instructions for the methods described above. The controllers may also include data storage medium for storing such computer programs, and/or hardware to receive such medium.

One or more embodiments of the invention may be applied to any immersion lithography apparatus, in particular, but not exclusively, those types mentioned above, whether the immersion liquid is provided in the form of a bath, only on a localized surface area of the substrate, or is unconfined on the substrate and/or substrate table. In an unconfined arrangement, the immersion liquid may flow over the surface of the substrate and/or substrate table so that substantially the entire uncovered surface of the substrate table and/or substrate is wetted. In such an unconfined immersion system, the liquid supply system may not confine the immersion liquid or it may provide a proportion of immersion liquid confinement, but not substantially complete confinement of the immersion liquid.

A liquid supply system as contemplated herein should be broadly construed. In certain embodiments, it may be a mechanism or combination of structures that provides a liquid to a space between the projection system and the substrate and/or substrate table. It may comprise a combination of one or more structures, one or more liquid inlets, one or more gas inlets, one or more gas outlets, and/or one or more liquid outlets that provide liquid to the space. In an embodiment, a surface of the space may be a portion of the substrate and/or substrate table, or a surface of the space may completely cover a surface of the substrate and/or substrate table, or the space may envelop the substrate and/or substrate table. The liquid supply system may optionally further include one or more elements to control the position, quantity, quality, shape, flow rate or any other features of the liquid.

The descriptions above are intended to be illustrative, not limiting. Thus, it will be apparent to one skilled in the art that modifications may be made to the invention as described without departing from the scope of the claims set out below.

The invention claimed is:

1. A substrate holder for use in a lithographic apparatus, the substrate holder comprising:
    a main body having a surface;
    a plurality of burls projecting from the surface and having end surfaces to support a substrate; and
    a heater and/or a temperature sensor, on the surface of the main body,
    wherein an open gap is located between the heater and/or temperature sensor and the surface of the main body.

2. The substrate holder of claim 1, comprising a thermally insulating layer between the heater and/or temperature sensor and the surface of the main body.

3. The substrate holder of claim 2, wherein the thermally insulating layer electrically isolates the heater and/or temperature sensor from the surface of the main body.

4. The substrate holder of claim 1, wherein the gap is substantially filled with a gas or the gap is substantially a vacuum gap.

5. The substrate holder of claim 1, wherein, in a direction perpendicular to the surface of the main body, a ratio of a thickness of the gap to a distance between the surface of the main body and the end surfaces is greater than or equal to about 2:5.

6. The substrate holder of claim 1, wherein the heater and/or temperature sensor is provided on a thermal interface plate distal from the surface of the main body.

7. The substrate holder of claim 6, wherein the thermal interface plate is porous and/or perforated.

8. The substrate holder of claim 6, wherein the thermal interface plate is connected to the main body by an adhesive and/or by a projection from an undersurface of the thermal interface plate.

9. The substrate holder of claim 1, comprising an electrical isolation layer between the heater and/or temperature sensor and the surface of the main body.

10. The substrate holder of claim 9, wherein, in a direction perpendicular to the surface of the main body, a ratio of a thickness of the electrical isolation layer to a distance between the surface of the main body and the end surfaces is greater than or equal to about 2:5.

11. The substrate holder of claim 1, wherein, in a direction perpendicular to the surface of the main body, a ratio of a distance between the heater and/or temperature sensor and the end surfaces to a distance between the surface of the main body and the end surfaces is less than or equal to about 1:3.

12. The substrate holder of claim 1, wherein, in a direction perpendicular to the surface of the main body, a distance between the surface of the main body and the end surfaces is in the range of from about 1 μm to about 5 mm.

13. The substrate holder of claim 1, wherein the heater and/or temperature sensor is formed, in plan, as a line following a tortuous path.

14. The substrate holder of claim 1, wherein the heater and/or temperature sensor extends across a substrate supporting area of the substrate holder from one edge to an opposite edge.

15. The substrate holder of claim 1, further comprising a fluid outlet configured to fill a gap between a bottom surface of the substrate and the heater and/or temperature sensor with a gas having a higher thermal conductivity than air.

16. A lithographic apparatus, comprising:
    a system to transfer a pattern onto a substrate;
    a substrate holder arranged to hold the substrate, the substrate holder comprising:
        a main body having a surface;
        a plurality of burls projecting from the surface and having end surfaces to support the substrate, and
        a heater and/or a temperature sensor, on the surface of the main body,
        wherein an open gap is located between the heater and/or temperature sensor and the surface of the main body.

17. The lithographic apparatus of claim 16, further comprising a fluid outlet configured to fill a gap between a bottom surface of the substrate and the heater and/or temperature sensor with a gas having a higher thermal conductivity than air.

18. A substrate holder for use in a lithographic apparatus, the substrate holder comprising:
    a main body having a surface;
    a plurality of burls projecting from the surface and having end surfaces to support a substrate;
    a heater and/or a temperature sensor, on the surface of the main body; and
    a thermally insulating layer between the heater and/or temperature sensor and the surface of the main body, wherein when a substrate is supported on the end surfaces, a vertical or shortest distance between the heater and/or temperature sensor and the surface of the main body is greater than a vertical or shortest distance between the heater and/or temperature sensor and the substrate.

19. The substrate holder of claim 18, comprising an electrical isolation layer between the heater and/or temperature sensor and the surface of the main body.

20. The substrate holder of claim 18, further comprising a planarization layer between the insulating layer and the surface of the main body.

* * * * *